United States Patent
Matsumoto

(10) Patent No.: US 8,610,091 B2
(45) Date of Patent: Dec. 17, 2013

(54) CHARGED PARTICLE BEAM WRITING APPARATUS AND CHARGED PARTICLE BEAM WRITING METHOD

(75) Inventor: Hiroshi Matsumoto, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 139 days.

(21) Appl. No.: 13/093,773

(22) Filed: Apr. 25, 2011

(65) Prior Publication Data

US 2011/0253911 A1    Oct. 20, 2011

(51) Int. Cl.
    *G21K 5/10* (2006.01)
(52) U.S. Cl.
    USPC ............. 250/492.22; 250/492.1; 250/492.2; 250/492.3
(58) Field of Classification Search
    USPC ....... 250/492.1, 492.2, 492.22, 492.3, 396 R, 250/398
    See application file for complete search history.

(56) References Cited

U.S. PATENT DOCUMENTS

| | | | | |
|---|---|---|---|---|
| 7,619,230 | B2 * | 11/2009 | Suzuki et al. ............ | 250/492.22 |
| 7,740,991 | B2 | 6/2010 | Emi et al. | |
| 2010/0015537 | A1 | 1/2010 | Emi et al. | |

FOREIGN PATENT DOCUMENTS

| | | |
|---|---|---|
| JP | 11-202470 A | 7/1999 |
| JP | 2007-005341 | 1/2007 |
| JP | 2007-150243 | 6/2007 |
| JP | 2009-64862 | 3/2009 |
| KR | 10-2007-0044767 A | 4/2007 |

OTHER PUBLICATIONS

Office Action issued Aug. 21, 2012, in Korean Patent Application No. 10-2011-0036274 with English translation.
U.S. Appl. No. 13/770,322, filed Feb. 19, 2013, Matsumoto.
U.S. Appl. No. 13/792,320, filed Mar. 11, 2013, Matsumoto.
Notice of Allowance issued Feb. 4, 2013 in Korean Application No. 10-2011-0036274.

* cited by examiner

*Primary Examiner* — Robert Kim
*Assistant Examiner* — Hanway Chang
(74) *Attorney, Agent, or Firm* — Oblon, Spivak, McClelland, Maier & Neustadt, L.L.P.

(57) ABSTRACT

A charged particle beam writing apparatus according to an embodiment, includes a first dose calculating unit configured to calculate a first dose map for each set of a proximity effect correction coefficient map and a base dose map of a beam; a dimension map creation unit configured to create a dimension map of a pattern by using the first dose map calculated for each set; an adder configured to add dimensions of all sets for each position of the dimension map by using the dimension map of each set; a set map creation unit configured to create a set of a proximity effect correction coefficient map and a base dose map by using an added dimension map after addition; and a second dose calculating unit configured to calculate a second dose map by using a created set of the proximity effect correction coefficient map and the base dose map.

15 Claims, 19 Drawing Sheets

| $D_{base}$ | $\eta$ | CD | $\delta_0$ | $\delta_{100}$ |
|---|---|---|---|---|
| . | . | . | . | . |
| . | . | . | . | . |
| . | . | . | . | . |
| 7.0 | 0.40 | 380 | −5 | 4 |
| 6.5 | 0.45 | 380 | −2 | 2 |
| 6.0 | 0.50 | 380 | 0 | 0 |
| 5.5 | 0.55 | 380 | 2 | −2 |
| 5.0 | 0.60 | 380 | 5 | −4 |
| 7.1 | 0.45 | 381 | −5 | 4 |
| 6.6 | 0.50 | 381 | −2 | 2 |
| 6.1 | 0.55 | 381 | 0 | 0 |
| 5.6 | 0.60 | 381 | 2 | −2 |
| 5.1 | 0.65 | 381 | 5 | −4 |
| . | . | . | . | . |
| . | . | . | . | . |
| . | . | . | . | . |

FIG. 10

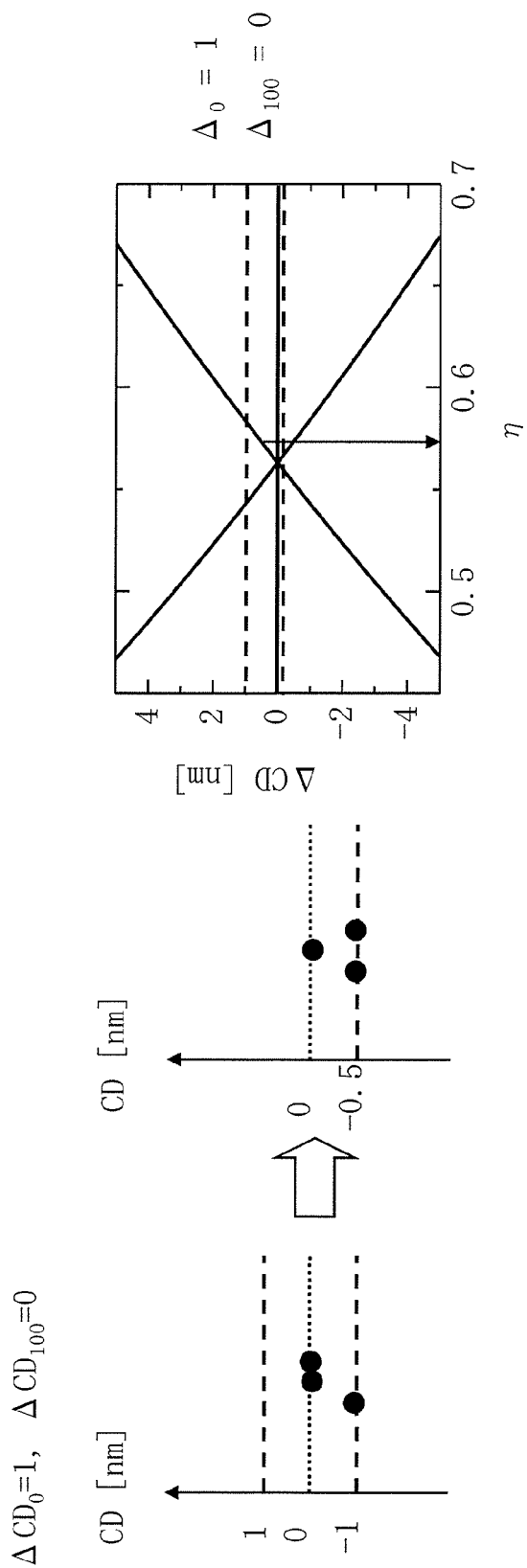

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priorities from prior Japanese Patent Application No. 2010-097161 filed on Apr. 20, 2010 in Japan, and from prior Japanese Patent Application No. 2010-097162 filed on Apr. 20, 2010 in Japan, the entire contents of which are incorporated herein by reference.

BACKGROUND OF THE INVENTION

1. Field of the Invention

The present invention relates to a charged particle beam writing apparatus and a charged particle beam writing method and, for example, relates to a technique to determine the dose of an electron beam to improve uniformity in line width in electron beam writing.

2. Related Art

A lithography technique, which leads development of micropatterning of a semiconductor device, is a very important process for exclusively generating a pattern in semiconductor manufacturing processes. In recent years, with an increase in integration density of an LSI, a circuit line width required for semiconductor devices is getting smaller year by year. In order to form a desired circuit pattern on such semiconductor devices, a high-precision original pattern (also called a reticle or a mask) is necessary. In this case, an electron beam writing technique has an essentially excellent resolution, and is used in production of high-precision original patterns.

FIG. 20 is a conceptual diagram for describing an operation of a variable-shaped electron beam writing apparatus.

The variable-shaped electron beam (EB) writing apparatus operates as described below. An oblong, for example, rectangular opening 411 to shape an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 irradiated from a charged particle source 430 and having passed through the opening 411 of the first aperture plate 410 is deflected by a deflector, passes through a part of the variable-shaped opening 421 of the second aperture plate 420, and is shone on a target object 340 placed on a stage continuously moving in one predetermined direction (for example, an X direction). That is, an oblong shape which can pass through both the opening 411 of the first aperture plate 410 and the variable-shaped opening 421 of the second aperture plate 420 is written in a write region of the target object 340 placed on the stage continuously moving in the X direction. A scheme which causes an electron beam to pass through both the opening 411 of the first aperture plate 410 and the variable-shaped opening 421 of the second aperture plate 420 to form an arbitrary shape is called a variable-shaping scheme (VSB scheme).

In the electron beam writing described above, more precise uniformity in line width in a target object plane, for example, a mask plane is demanded. In such electron beam writing, if a mask coated with a resist is irradiated with an electron beam to write a circuit pattern, a phenomenon called a proximity effect caused by back scattering of the electron beam that passes through the resist layer to reach a layer below the resist layer and then reenters the resist layer occurs. Dimensional fluctuations in which lines are written in dimensions deviating from desired dimensions when lines are written are thereby caused. On the other hand, dimensional fluctuations called a loading effect resulting from the density of circuit patterns are caused also when the development or etching is performed after writing.

The dose of an electron beam is calculated as a product of, for example, a base dose $D_{base}$ and a proximity effect-corrected dose $Dp(\eta,U)$ depending on a proximity effect correction coefficient $\eta$ to correct the proximity effect and a pattern area density $\rho$ or a proximity effect density $U$. The proximity effect correction coefficient $\eta$ that fits the proximity effect correction well is present for each base dose $D_{base}$. Dimensions of a resist image increase with an increasing base dose $D_{base}$.

Thus, a first technique that also corrects dimensional fluctuations caused by the loading effect while maintaining the proximity effect correction by changing the set of the base dose $D_{base}$ and the proximity effect correction coefficient $\eta$ for each position of a substrate is known (see Japanese Patent Application Laid-Open No. 2007-150243, for example). In recent years, the user is required to create set data of a base dose $D_{base}$ map and a proximity effect correction coefficient $\eta$ map for each cause of dimensional fluctuations such as the loading effect and to write using such a plurality of set data on the writing device side. However, the base dose $D_{base}$ and the proximity effect correction coefficient $\eta$ cannot simply be combined and thus, it is difficult to use a plurality of set data for writing on the writing apparatus side.

In doses obtained by the first technique, the same dimensional variation is obtained regardless of the proximity effect density U. That is, a dimensional correction is made such that the proximity effect correction is not shifted. Such a dimensional correction is appropriate for correction of the loading effect caused during etching of a light-shielding film after writing.

On the other hand, a second technique that makes correction by changing the base dose $D_{base}$ in accordance with the dimension to be corrected and the dose latitude without changing the proximity effect correction coefficient $\eta$ is also known. According to the second technique, a different amount of dimensional correction is obtained for each proximity effect density. The technique is appropriate for correction when the embedded dose adjusted by the proximity effect correction deviates from a threshold at the time of developing a resist. Therefore, the second technique is appropriate for correction of the loading effect resulting from non-uniformity of the development threshold caused by irregularities in density of a developing solution.

An error in pattern dimensions caused by the loading effect when a mask is actually produced has the loading effect during development and the loading effect during etching as described above merged therein. That is, both effects may be mixed in the same position. Thus, the correction by one of the above techniques may not be enough. Therefore, a third technique by which the former is corrected by the first technique and the latter by the second technique is discussed. However, it is necessary for the user to separate dimensional errors that actually occur into components for the first technique and components for the second technique to make corrections by the third technique and it is very difficult to do this. Moreover, the above third technique cannot be applied if it becomes necessary to change the proximity effect correction coefficient $\eta$ used for correction between the loading effect during development and the loading effect during etching.

As described above, the user is required to create set data of a base dose $D_{base}$ map and a proximity effect correction coefficient η map for each cause of dimensional fluctuations such as the loading effect and to write using such a plurality of set data on the writing device side. However, there is a problem that even if the plurality of set data is input from the writing device side, it is difficult to write by combining the plurality of set data.

Moreover, both of the above techniques have a problem that it is difficult to make adequate corrections of both of dimensional fluctuations caused by the loading effect during development and dimensional fluctuations caused by the loading effect during etching while correcting the proximity effect.

BRIEF SUMMARY OF THE INVENTION

A charged particle beam writing apparatus according to an embodiment, includes a storage unit configured to input and store a plurality of set data including a set of a proximity effect correction coefficient map and a base dose map of a beam; a first dose calculating unit configured to read each the set data and to calculate a first dose map for each set; a dimension map creation unit configured to create a dimension map of a pattern by using the first dose map calculated for each set; an adder configured to add dimensions of all sets for each position of the dimension map by using the dimension map of each set; a set map creation unit configured to create a set of a proximity effect correction coefficient map and a base dose map by using an added dimension map after addition; a second dose calculating unit configured to calculate a second dose map by using a created set of the proximity effect correction coefficient map and the base dose map; and a writing unit configured to write the pattern to a target object by using a charged particle beam of a dose defined in the second dose map.

A charged particle beam writing apparatus according to an embodiment, includes a storage unit configured to input and store a plurality of set data including a set of a proximity effect correction coefficient map and a base dose map of a beam; a first dose calculating unit configured to read each the set data and to calculates a first dose map for each set; a dimension map creation unit configured to create a dimension map of a pattern for each of a plurality of proximity effect densities by using the first dose map calculated for each set; an adder configured to add dimensions of all sets for each position of the dimension map for each proximity effect density by using a plurality of dimension maps for mutually different proximity effect densities of each set; a selection unit configured to select a set of a proximity effect correction coefficient and a base dose with which dimensional errors of the pattern are corrected for a part of the proximity effect densities and correction residues of dimensional errors of the pattern are generated for a remaining proximity effect densities by using a plurality of added dimension maps for the mutually different proximity effect densities after addition; a correction term calculating unit configured to calculate a correction term to correct the correction residues depending on the proximity effect density for each position of the map; a second dose calculating unit configured to calculate a second dose map by using a selected set of the proximity effect correction coefficient and the base dose and the correction term in each position of the map; and a writing unit configured to write the pattern to a target object by using a charged particle beam of a dose defined in the second dose map.

A charged particle beam writing apparatus according to an embodiment, includes a storage unit configured to input and store a correlation information among a pattern area ratio, a proximity effect correction coefficient, and a base dose for each of a plurality of phenomena causing dimensional fluctuations in a mask plane when mask fabricating; a first set map creation unit configured to read each of the correlation information and to create a first set of a proximity effect correction coefficient map and a base dose map to correct the phenomenon for each phenomenon; a first dose calculating unit configured to calculate a first dose map by using a corresponding proximity effect correction coefficient map and a base dose map for each set of the first sets; a dimension map creation unit configured to create a dimension map of a pattern by using the first dose map calculated for each set of the first sets; an adder configured to add dimensions of all sets for each position of the dimension map by using the dimension map of each set of the first sets; a set map creation unit configured to create a second set of a proximity effect correction coefficient map and a base dose map by using an added dimension map after addition; a second dose calculating unit configured to calculate a second dose map by using the second set of the proximity effect correction coefficient map and the base dose map; and a writing unit configured to write the pattern to a target object by using a charged particle beam of a dose defined in the second dose map.

A charged particle beam writing apparatus according to an embodiment, includes a storage device configured to input and store a plurality of pattern dimension map data for mutually different proximity effect densities indicating a distribution of a pattern dimension formed on a substrate when a pattern is written to the substrate by making the proximity effect density variable; a selection unit configured to select a set of a proximity effect correction coefficient and a base dose with which dimensional errors of the pattern dimension are corrected for a part of the proximity effect densities and correction residues of dimensional errors of the pattern dimension are generated for a remaining proximity effect densities when a writing position corresponding to a map position is written to with a dose obtained by a dose function correcting dimensional errors calculated by using the proximity effect correction coefficient and the base dose for each map position; a correction term calculating unit configured to calculate a correction term to correct the correction residues depending on the proximity effect density for each map position; a dose calculating unit configured to calculate a dose by using a selected set of the proximity effect correction coefficient and the base dose and the correction term for each map position; and a writing unit configured to write a desired pattern to the substrate by using a charged particle beam of the dose calculated for each map position.

A charged particle beam writing method according to an embodiment, includes reading each of set data from a storage device storing a plurality of set data including a set of a proximity effect correction coefficient map and a base dose map and calculating a first dose map for each set; creating a dimension map of a pattern by using a calculated first dose map for each set; adding dimensions of all sets for each position of the dimension map by using the dimension map of each set; creating a set of a proximity effect correction coefficient map and a base dose map by using an added dimension map after addition; calculating a second dose map by using a created set of the proximity effect correction coefficient map and the base dose map; and writing the pattern to a target object by using a charged particle beam of a dose defined in the second dose map.

A charged particle beam writing method according to an embodiment, includes reading each piece of set data from a storage device storing a plurality of set data including a set of a proximity effect correction coefficient map and a base dose map and calculating a first dose map for each set; creating a plurality of dimension maps of a pattern for a plurality of proximity effect densities by using a calculated first dose map for each set; adding dimensions of all sets in each position of the dimension map for each proximity effect density by using a plurality of dimension maps for mutually different proximity effect densities of each set; selecting a set of a proximity effect correction coefficient and a base dose with which dimensional errors of the pattern are corrected for a part of the proximity effect densities and correction residues of dimensional errors of the pattern are generated for a remaining proximity effect densities by using a plurality of added dimension maps for the mutually different proximity effect densities after addition; calculating a correction term to correct the correction residues depending on the proximity effect density for each position of the map; calculating a second dose map by using a selected set of the proximity effect correction coefficient and the base dose and the correction term in each position of the map; and writing the pattern to a target object by using a charged particle beam of a dose defined in the second dose map.

A charged particle beam writing method according to an embodiment, includes reading a plurality of pattern dimension map data from a storage device storing the plurality of pieces of pattern dimension map data, for mutually different proximity effect densities, indicating a distribution of a pattern dimension formed on a substrate when a pattern is written to the substrate by making the proximity effect density variable; selecting a set of a proximity effect correction coefficient and a base dose with which dimensional errors of the pattern dimension are corrected for a part of the proximity effect densities and correction residues of dimensional errors of the pattern dimension are generated for a remaining proximity effect densities when a writing position corresponding to a map position is written to with a dose obtained by a dose function correcting dimensional errors calculated by using the proximity effect correction coefficient and the base dose for each map position; calculating a correction term to correct the correction residues depending on the proximity effect density for each map position; calculating a dose by using a selected set of the proximity effect correction coefficient and the base dose and the correction term for each map position; and writing the desired pattern to the substrate by using a charged particle beam of the dose calculated for each map position.

BRIEF DESCRIPTION OF THE DRAWINGS

FIG. 10 is a diagram showing an example of the correlation data among the base dose, the proximity effect correction coefficient, the pattern dimension when U(x)=0.5, and a dimensional fluctuation amount when U(x) is other than 0.5 according to the second embodiment;

FIGS. 14A to 14C are diagrams showing another example of the dose correction according to the second embodiment;

DETAILED DESCRIPTION OF THE INVENTION

In the following embodiments, a configuration which uses an electron beam as an example of a charged particle beam will be described. The charged particle beam is not limited to an electron beam, and a beam using charged particles such as an ion beam may be used. In the following embodiments, a variable-shaped writing apparatus as an example of the charged particle beam writing apparatus will be described.

First Embodiment

In the first embodiment, an apparatus capable of calculating a dose by using a plurality of set data after the plurality of set data of the base dose $D_{base}$ map and the proximity effect correction coefficient η map created on the user side is input and a method therefor will be described below.

Figure 1:
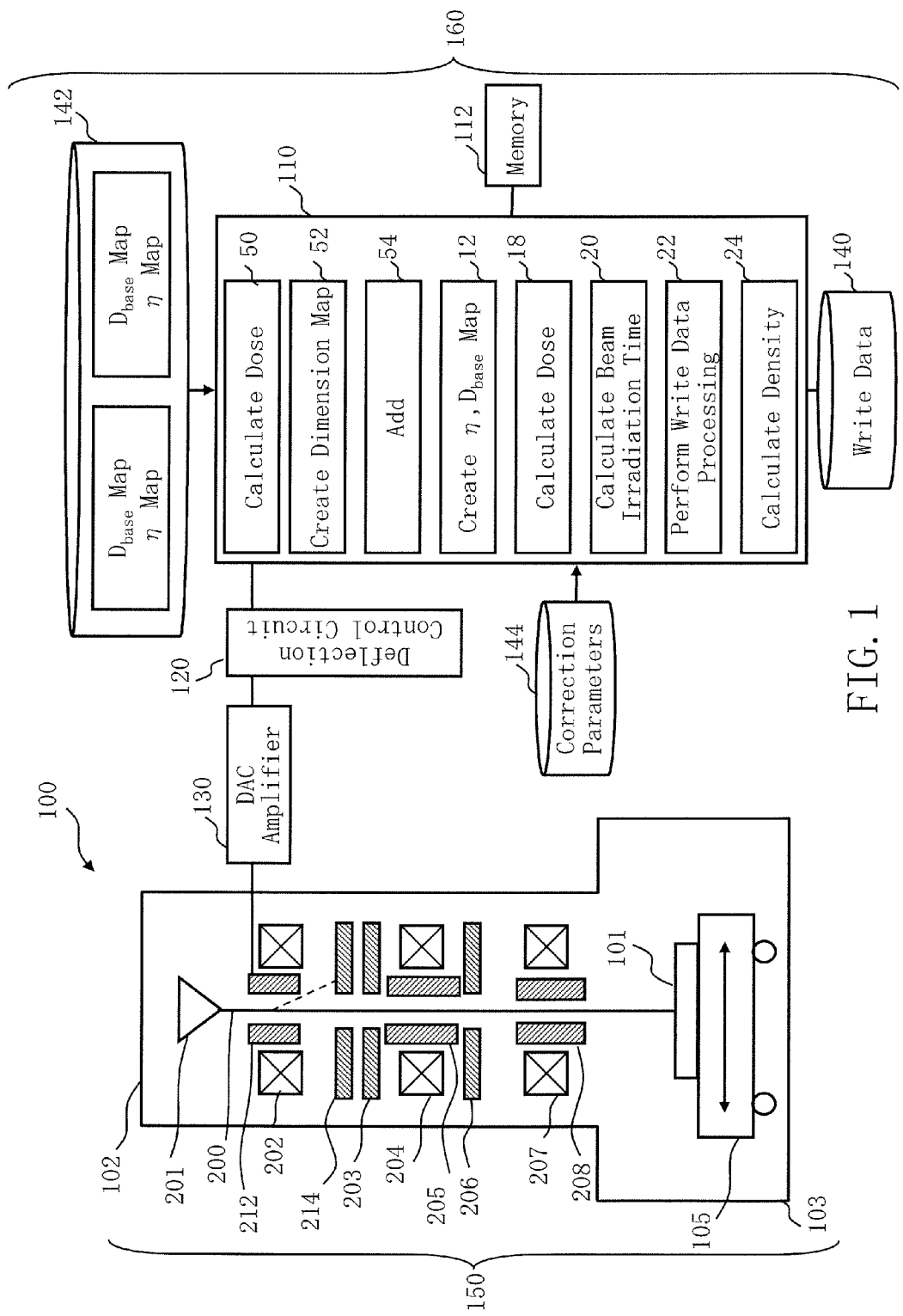
FIG. 1 is a conceptual diagram showing a configuration of a writing apparatus according to a first embodiment.

FIG. 1 is a conceptual diagram showing a configuration of a writing apparatus according to the first embodiment. In FIG. 1, a writing apparatus 100 includes a pattern writing unit 150 and a control unit 160. The writing apparatus 100 is an example of the charged particle beam writing apparatus. Particularly, the writing apparatus 100 is an example of the variable-shaped (VSB type) writing apparatus. The pattern writing unit 150 includes an electron lens barrel 102 and a pattern writing chamber 103. In the electron lens barrel 102, an electron gun assembly 201, an illumination lens 202, a blanking deflector (blanker) 212, a blanking aperture plate 214, a first shaping aperture plate 203, a projection lens 204, a deflector 205, a second shaping aperture plate 206, an objective lens 207, and a deflector 208 are arranged. In the pattern writing chamber 103, an X-Y stage 105 capable of moving at least in the XY directions is arranged. On the X-Y stage 105, a target object 101 to be written to is placed. The target object 101 includes, for example, a mask for exposure and a silicon wafer to produce a semiconductor device. The mask includes mask blanks.

The control unit 160 includes a control computer 110, a memory 112, a deflection control circuit 120, a DAC (digital-analog converter) amplification unit 130 (deflection amplifier), and storage devices 140, 142, 144 such as magnetic disk drives. The control computer 110, the memory 112, the deflection control circuit 120, and the storage devices 140, 142 such as magnetic disk drives are connected to each other by a bus (not shown). The DAC amplification unit 130 is connected to the deflection control circuit 120. The DAC amplification unit 130 is connected to the deflector 212.

A digital signal for blanking control is output from the deflection control circuit 120 to the DAC amplification unit 130. Then, the DAC amplification unit 130 converts the digital signal into an analog signal and amplifies the analog signal, which is then applied to the deflector 212 as a deflection voltage. An electron beam 200 is deflected by the deflection voltage to form a beam for each shot.

In the control computer 110, a dose calculating unit 50 or "dose operation unit 50", a dimension map creation unit 52, an adder 54, a proximity effect correction coefficient η/base dose $D_{base}$ map creation unit 12, a dose calculating unit 18 or "dose operation unit 18", a beam irradiation time calculating unit 20, a write data processing unit 22, and a density calculation unit 24 are arranged. Each function of the dose calculating unit 50, the dimension map creation unit 52, the adder 54, the proximity effect correction coefficient η/base dose $D_{base}$ map creation unit 12, the dose calculating unit 18, the beam irradiation time calculating unit 20, the write data processing unit 22, and the density calculation unit 24 may be configured by software such as a program. Alternatively, such functions may be configured by hardware such as an electronic circuit. In addition to the above alternatives, these alternatives may be combined. Input data necessary for the control computer 110 or a calculation result, or "operation result" is stored each time in the memory 112. Similarly, the deflection control circuit 120 may be configured as a computer operated by software such as a program or by hardware such as an electronic circuit. Alternatively, these alternatives may be combined. Here, in FIG. 1, only the configuration needed to explain the first embodiment is shown. The writing apparatus 100 may generally include other necessary configurations. For example, it is needless to say that each DAC amplification unit for the deflector 205 and the deflector 208 is included.

Figure 2:
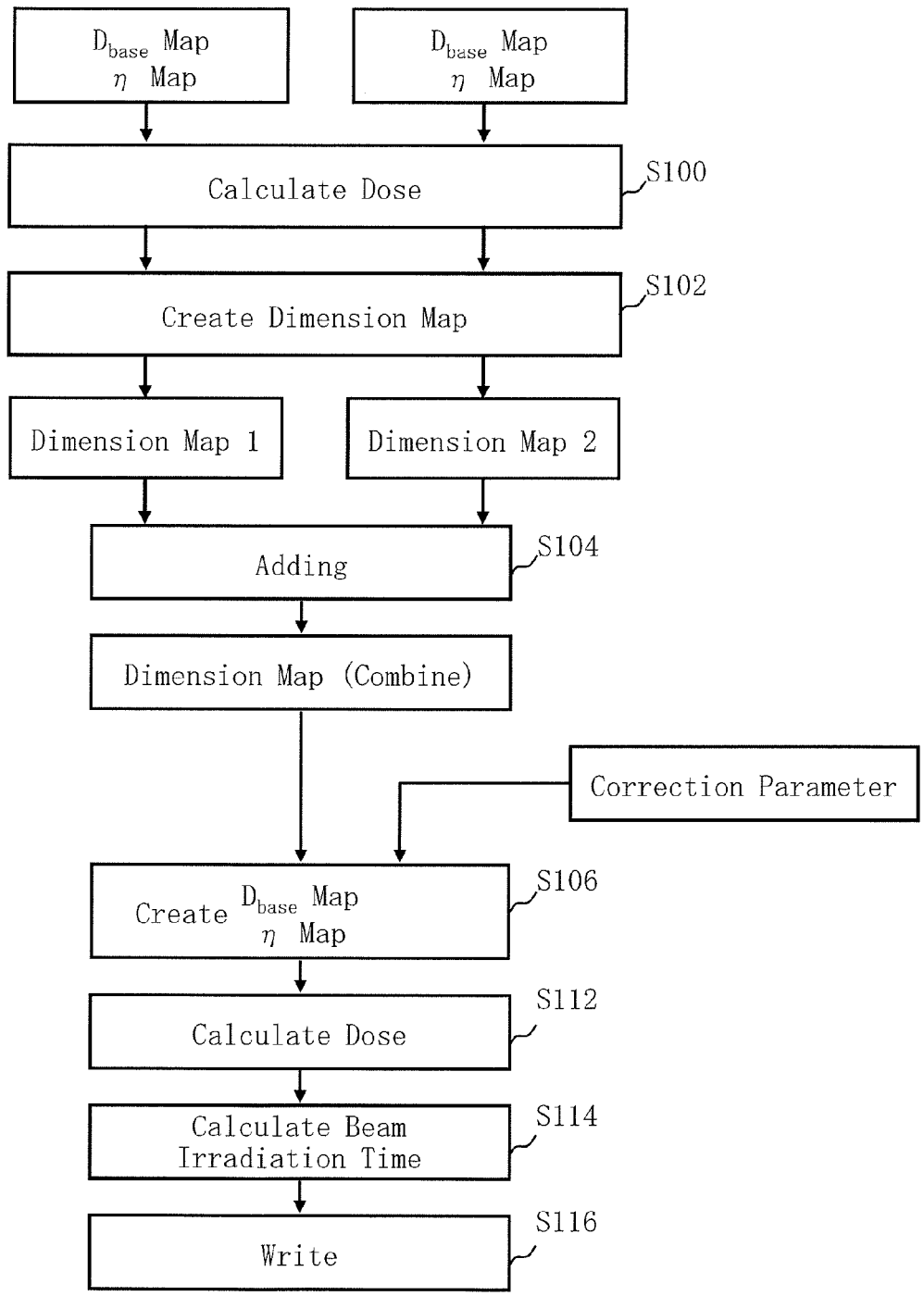
FIG. 2 is a flowchart showing principal portion processes of a writing method according to the first embodiment.

FIG. 2 is a flowchart showing principal portion processes of a writing method according to the first embodiment. In FIG. 2, the writing method according to the first embodiment executes a series of processes including a dose calculating process (S100), a dimension map creation process (S102), an addition process (S104), a proximity effect correction coefficient η/base dose $D_{base}$ map creation process (S106), a dose calculating process (S112), a beam irradiation time calculating process (S114), and a writing process (S116).

First, a plurality of set data in which a set includes a base dose $D_{base}$ map and a proximity effect correction coefficient η map created on the user side and depending on the position is input from outside the writing apparatus 100 and stored in the storage device 142. The plurality of set data contains set data to correct dimensional fluctuations (or, deviations) of patterns caused by the loading effect when the target object 101 is developed and set data to correct dimensional fluctuations of patterns caused by the loading effect when a light-shielding film of chrome (Cr) or the like is etched after the development of the target object 101.

In the writing apparatus 100, the write data processing unit 22 reads write data input from outside and stored in the storage device 140 from the storage device 140 and performs data conversion processing in a plurality of stages. Then, the write data processing unit 22 generates shot data specific to the writing apparatus by the data conversion processing in the plurality of stages. Then, writing processing is performed according to the shot data. The density calculation unit 24 reads the write data, calculates a pattern area density in each position, and further calculates a proximity effect density U(x) in each position.

The proximity effect density U(x) is defined as a value obtained by convolution of a pattern area density ρ(x) in a proximity effect mesh with a distribution function g(x) over a range beyond the range of influence of the proximity effect. The proximity effect mesh is suitably of size of, for example, 1/10 of the range of influence of the proximity effect and the size of, for example, about 1 μm is suitable. The proximity effect density U(x) is defined by Formula (1) shown below. x is a vector indicating the position.

$$U(x) = \int \rho(x')g(x-x')dx' \tag{1}$$

As the dose calculating process (S100), the dose calculating unit 50 (first dose calculating unit) reads each piece of set data from the storage device 142 to calculate a dose map (first dose map) for each set. A dose D is defined by Formula (2) (dose function) shown below.

$$D(x, U) = D_{base}(x)D_p(\eta(x), U(x)) \tag{2}$$

As shown in Formula (2), the dose D(x, U) can be defined as a product of the base dose $D_{base}(x)$ and the proximity effect-corrected dose $D_p(\eta(x), U(x))$ depending on a proximity effect correction coefficient η(x) and the proximity effect density U(x).

Next, as the dimension map creation process (S102), the dimension map creation unit 52 creates a dimension map of pattern for each set by using the calculated first dose map.

Figure 3:
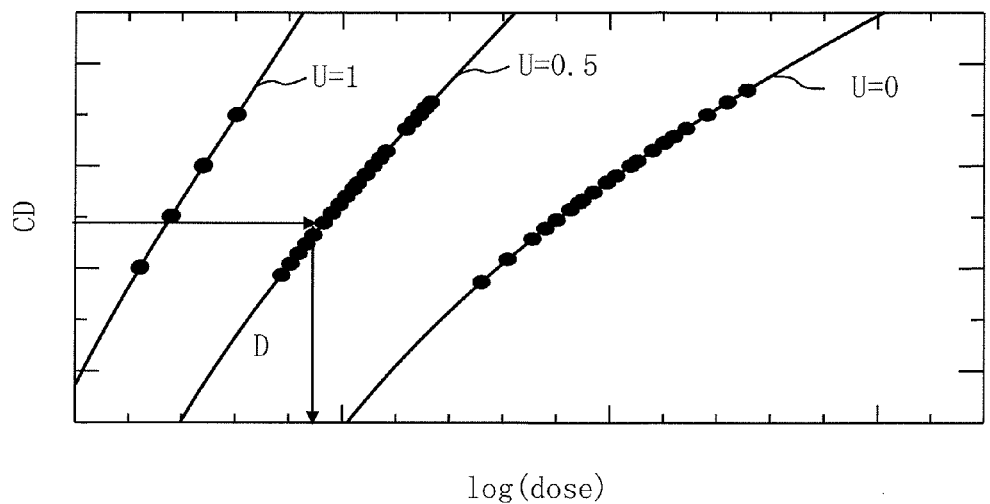
FIG. 3 is a graph showing an example of correlation data between a pattern dimension CD and a dose D according to the first embodiment.

FIG. 3 is a graph showing an example of correlation data between a pattern dimension CD and a dose D in the first embodiment. The vertical axis of the graph represents the pattern dimension CD and the horizontal axis represents the dose D logarithmically. Here, the correlation data is determined by experiments for each case of the proximity effect density U(x)=0 (0%), 0.5 (50%), and 1 (100%). The proximity effect density U(x)=0 means that there is actually no pattern and thus, the correlation data can approximately be determined by writing, for example, one line pattern for measurement in a state in which there is nothing therearound. Conversely, the proximity effect density U(x)=1 means that the entire mesh including the surroundings is filled with patterns and dimensions cannot be measured and thus, the correlation data can approximately be determined by writing, for example, one line pattern for measurement in a state in which the entire surroundings are filled with patterns. If a 1:1 line and space pattern is written by assuming the density of, for example, 50%, one mesh may contain only a line pattern and an adjacent mesh may contain only a space pattern because the mesh size is small. In such a case, the pattern area density ρ(x) becomes a density inside a mesh regardless of the surroundings thereof. By using the proximity effect density U(x), by contrast, the density of each mesh can be calculated to be 50%. The proximity effect density U(x) to be set is not limited to cases of 0%, 50%, and 100%. For example, three values of 10% or less, 50%, and 90% or more may suitably be used as the proximity effect density U(x). The number of cases of the proximity effect density U(x) is not limited to three and any other number of cases of the proximity effect density U(x) may be used for measurement. For example, four cases of the proximity effect density U(x) or more may be used for measurement. Correlation data between the pattern dimension CD and the dose D is stored in the storage device 144 as a correction parameter.

Figure 4:
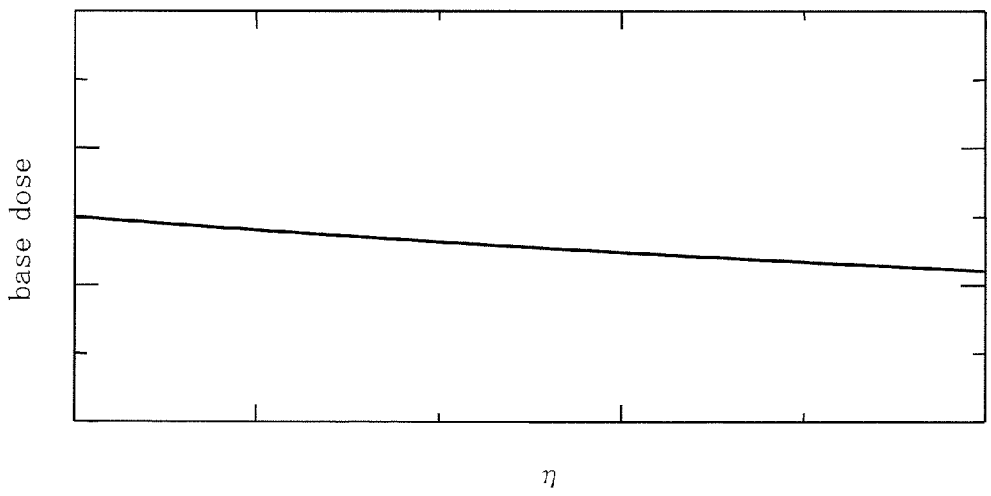
FIG. 4 is a graph showing an example of the correlation data between the proximity effect correction coefficient η and the base dose $D_{base}$ according to the first embodiment.

FIG. 4 is a graph showing an example of the correlation data between the proximity effect correction coefficient η and the base dose $D_{base}$ according to the first embodiment. The vertical axis of the graph represents the base dose $D_{base}$ and the horizontal axis represents the proximity effect correction coefficient η. Here, for example, the proximity effect density U(x) of 50% is set as the reference proximity effect density and correlation data between the proximity effect correction coefficient η and the base dose $D_{base}$ with which the pattern dimension CD becomes constant in the reference proximity effect density is shown. The proximity effect correction coefficient η that fits the proximity effect correction well is present for each base dose $D_{base}$. The pattern dimension is made variable in advance to calculate correlation data for each pattern dimension before writing. Correlation data between the proximity effect correction coefficient η and the base dose $D_{base}$ is stored in the storage device 144 as a correction parameter. Alternatively, the correlation data may be calculated from correlation data between the pattern dimension CD and the dose D by the dimension map creation unit 52.

The dimension map creation unit 52 calculates the dimension of pattern corresponding to the dose in each calculated position by referring to the correlation data between the pattern dimension CD and the dose D. Then, the dimension map creation unit 52 creates a dimension map of pattern for each set. Here, one of a plurality of proximity effect densities U(x) is set as the reference proximity effect density to calculate the dimension of pattern corresponding to the dose in the reference proximity effect density. As the reference proximity effect density, for example, the proximity effect density U(x) =0.5 is used. A plurality of dimension maps 1, 2 corresponding to the plurality of set data can be created by the processes described above.

Figure 5:
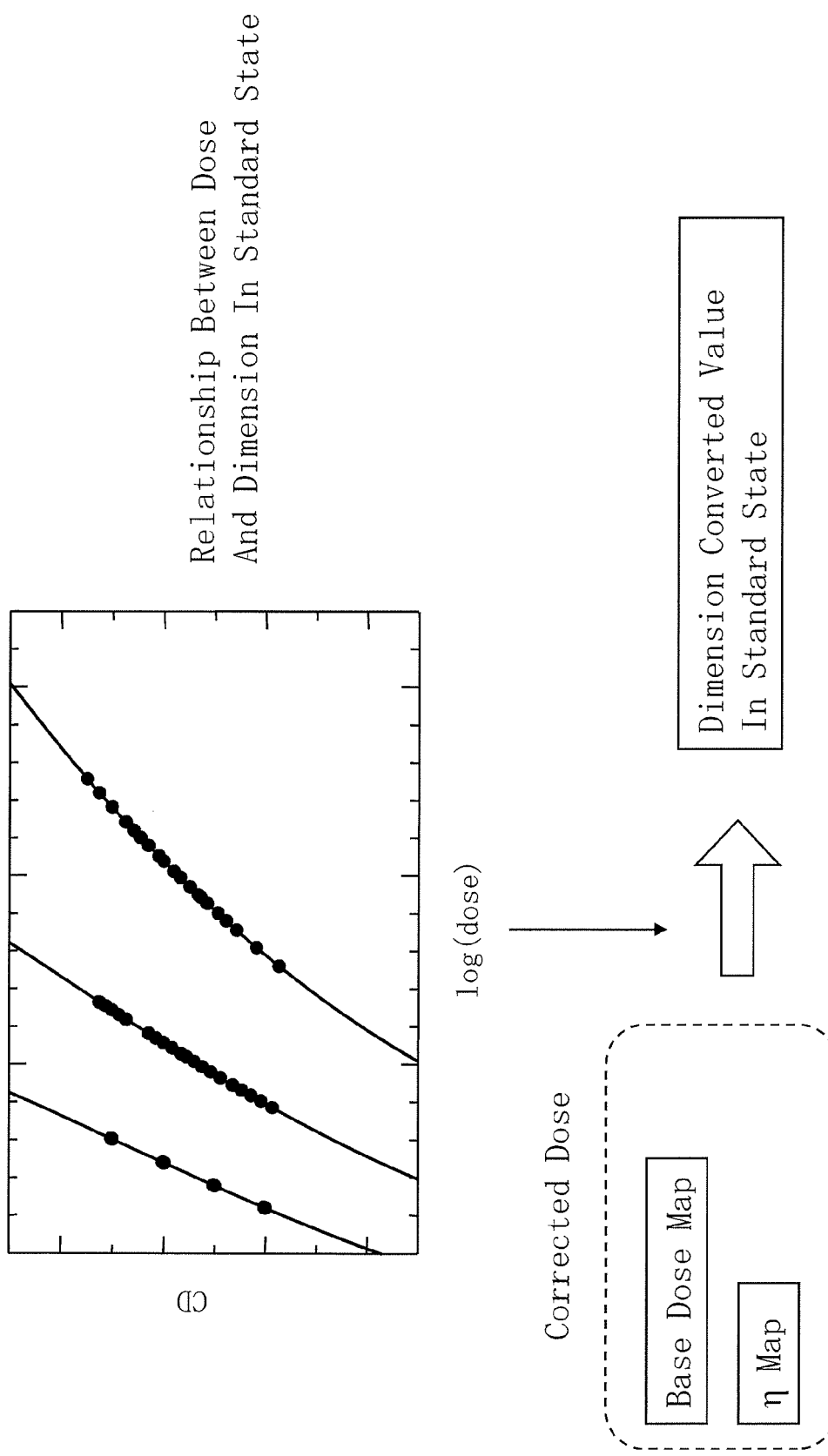
FIG. 5 is a conceptual diagram for explaining an calculating method of a pattern dimension according to the first embodiment.

FIG. 5 is a conceptual diagram for explaining an calculating method of a pattern dimension in the first embodiment. If the proximity effect correction coefficient η and the base dose $D_{base}$ are decided, as described above, the dose D can be calculated by using Formula (2). Then, if the dose D is determined, the pattern dimension can be determined from the correlation data between the pattern dimension CD and the dose D shown in FIG. 3.

Figure 6:
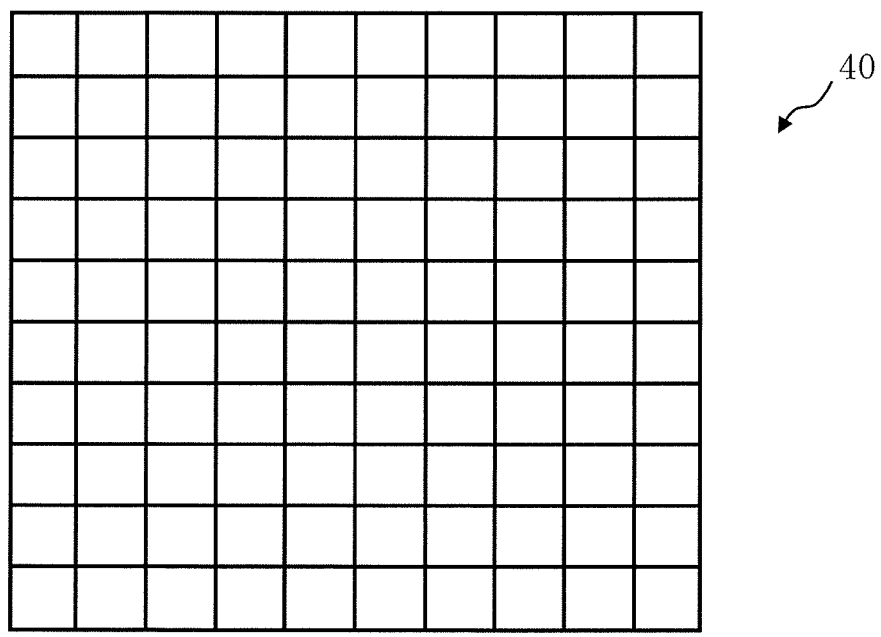
FIG. 6 is a conceptual diagram for explaining a dimension map according to the first embodiment.

FIG. 6 is a conceptual diagram for explaining a dimension map in the first embodiment. A dimension map 40 has the pattern dimension corresponding to the position of each mesh by dividing a write region into mesh regions of a predetermined size. The mesh size of the dimension map 40 is suitably of size of, for example, 1/10 of the range of influence of the loading effect to be used for correcting the loading effect. For example, the mesh is suitably a mesh of 1 mm per side.

As the addition process (S104), the adder 54 adds dimensions of all sets for each position of the dimension map by using the dimension map of each set. While it is difficult to simply combine the proximity effect correction coefficients η or the base doses of the beam $D_{base}$, such parameters are converted into dimensions in the first embodiment and when set data of the base dose $D_{base}$ map and the proximity effect correction coefficient η map individually set for each of a plurality of phenomena is input, such converted dimensions can be combined.

As the proximity effect correction coefficient η/base dose $D_{base}$ map creation process (S106), the proximity effect correction coefficient η/base dose $D_{base}$ map creation unit 12 creates a set of the proximity effect correction coefficient map and base dose map by using the added dimension maps obtained by addition. The proximity effect correction coefficient η/base dose $D_{base}$ map creation unit 12 is an example of a set map creation unit. Here, the proximity effect correction coefficient η/base dose $D_{base}$ map creation unit 12 creates both of the proximity effect correction coefficient map and base dose map, but is not limited to this. It is needless to say that the proximity effect correction coefficient η/base dose $D_{base}$ map creation unit 12 may function by being divided into a proximity effect correction coefficient map creation unit and a base dose map creation unit. Here, a set of the proximity effect correction coefficient η producing the corresponding dose and the base dose $D_{base}$ is calculated as a pattern dimension in the reference proximity effect density (U(x)=0.5) for each position of the map.

As the dose calculating process (S112), the dose calculating unit 18 (second dose calculating unit) calculates a dose map (second dose map) in each position in the proximity effect density U(x) obtained from write data by using a set of a proximity effect correction coefficient map and a base dose map created after dimensions are combined. The dose D may be calculated by using the above Formula (2).

The dose calculating unit 18 may calculate a value obtained by further multiplying each value of the dose map calculated by using the created set of the proximity effect correction coefficient map and the base dose map by a correction coefficient of the fogging effect defined for each map position as the dose map (second dose map) here.

By calculating the dose D as described above, entire dimensional fluctuations based on a plurality of phenomena such as dimensional fluctuations caused by the loading effect during development and dimensional fluctuations caused by the loading effect during etching can be corrected without distinguishing the phenomena while also correcting the proximity effect.

As the beam irradiation time calculating process (S114), the beam irradiation time calculating unit 20 calculates a beam irradiation time T of the electron beam 200 in each position of the write region. The dose D can be defined as a product of the beam irradiation time T and a current density J and thus, the beam irradiation time T can be determined by dividing the dose D by the current density J. The calculated beam irradiation time is output to the deflection control circuit 120.

As the writing process (S116), the pattern writing unit 150 writes a desired pattern on the target object 101 by using the electron beam 200 of the dose defined in the dose map (second dose map). A more concrete operation will be described below. The deflection control circuit 120 outputs a digital signal to control the beam irradiation time for each shot to the DAC amplification unit 130. Then, the DAC amplification unit 130 converts the digital signal into an analog signal and amplifies the analog signal, which is then applied to the blanking deflector 212 as a deflection voltage.

The electron beam 200 emitted from the electron gun assembly 201 (discharge unit) is controlled to pass through the blanking aperture plate 214 by the blanking deflector 212 when passing through the blanking deflector 212 in a beam ON state and controlled to be deflected so that the whole beam is blocked by the blanking aperture plate 214 in a beam OFF state. The electron beam 200 having passed through the blanking aperture plate 214 during a time from the beam OFF state to the beam ON state and back to the beam OFF state becomes an electron beam for one shot. The blanking deflector 212 alternately generates the beam ON state and the beam OFF state by controlling the orientation of the passing electron beam 200. For example, no voltage may be applied for the beam ON state and a voltage may be applied to the blanking deflector 212 for the beam OFF state. The dose of the electron beam 200 per shot shone on the target object 101 is adjusted by the beam irradiation time T of each of such shots.

The electron beam 200 of each shot generated by being passed through the blanking deflector 212 and the blanking aperture plate 214 illuminates the whole first shaping aperture plate 203 having an oblong, for example, rectangular hole through the illumination lens 202. Here, the electron beam 200 is first formed into an oblong, for example, a rectangular shape. Then, the electron beam 200 of a first aperture image having passed through the first shaping aperture plate 203 is projected onto the second shaping aperture plate 206 through the projection lens 204. The first aperture image is controlled to deflect by the deflector 205 on the second shaping aperture plate 206 so that the beam shape and dimensions thereof can be changed (variably shaped). Such variable shaping is performed for each shot and a different beam shape and dimensions are formed for each normal shot. Then, the electron beam 200 of a second aperture image having passed through the second shaping aperture plate 206 is focused by the objective lens 207 and deflected by the deflector 208 before being shone onto a desired position of the target object arranged on the continuously moving XY stage 105. Thus, a plurality of shots of the electron beam 200 is successively deflected onto the target object 101 to be a substrate by each deflector.

According to the first embodiment, as described above, even if a plurality of set data of the proximity effect correction coefficient map and the base doses of the beam map is input, such data can be combined in the apparatus.

Then, according to the first embodiment, even if dimensional fluctuations based on a plurality of phenomena are input as set data of the proximity effect correction coefficient η map and the base dose $D_{base}$ map that makes a correction for each phenomenon, the data can be converted into the proximity effect correction coefficient η map and the base dose $D_{base}$ map capable of correcting dimensional fluctuations based on the plurality of phenomena together. Therefore, even if set data of a plurality of set data of the base dose $D_{base}$ map and the proximity effect correction coefficient η map created on the user side is input, the dose can be calculated by using the plurality of set data.

Second Embodiment

In the first embodiment, a dimension conversion is made in the reference proximity effect density (U(x)=0.5) by assuming that similar dimensions are obtained also when the proximity effect density is other than the reference proximity effect density (U(x)=0.5) and after combination, the base dose $D_{base}$ map and the proximity effect correction coefficient η map are created in the reference proximity effect density (U(x)=0.5). However, the present invention is not limited to this. In the second embodiment, dimension conversions are made in a plurality of proximity effect densities U(x) to improve precision and after combination, the base dose $D_{base}$ map and the proximity effect correction coefficient η map are created.

Figure 7:
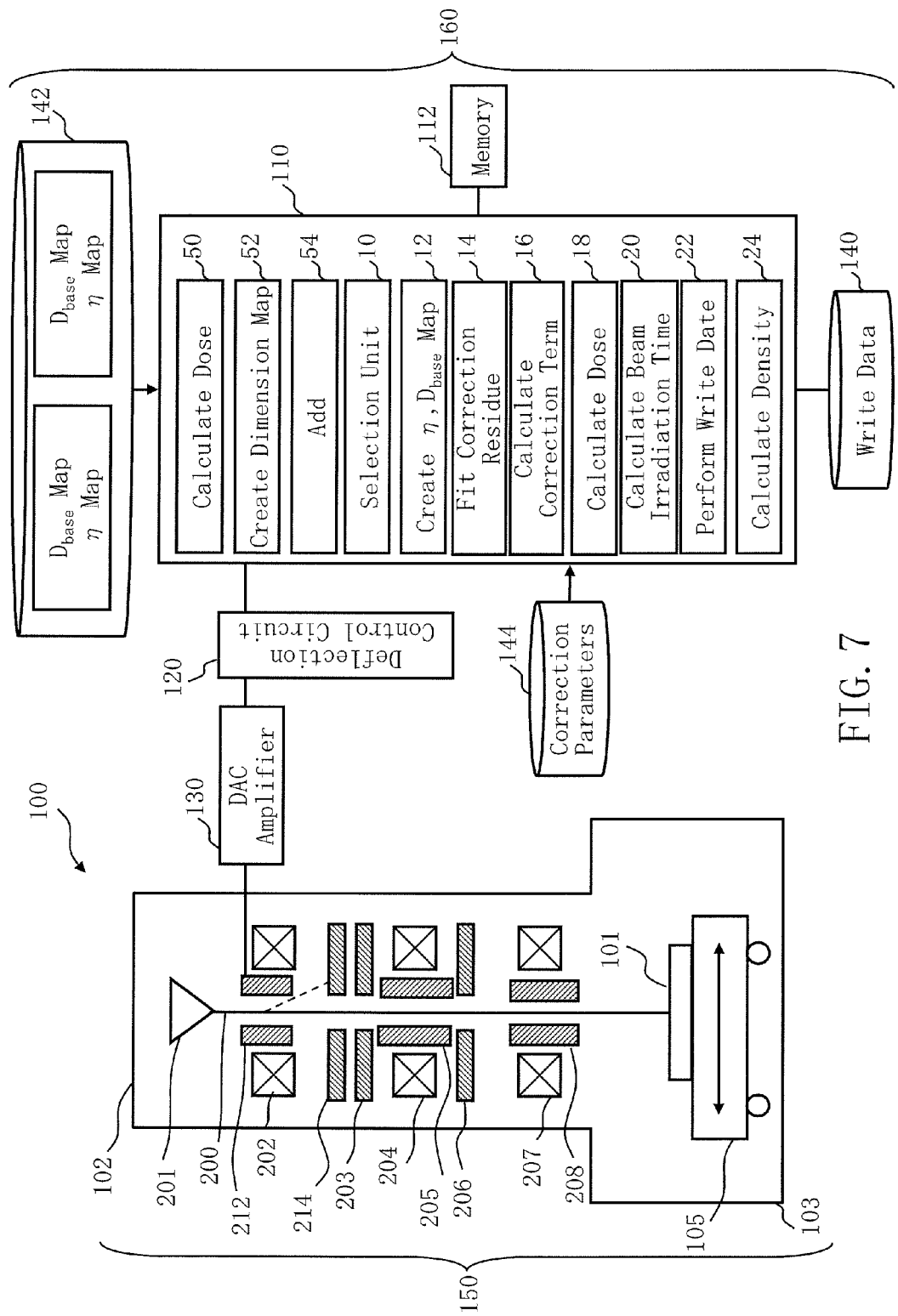
FIG. 7 is a conceptual diagram showing the configuration of a writing apparatus according to a second embodiment.

FIG. 7 is a conceptual diagram showing the configuration of the writing apparatus according to the second embodiment. FIG. 7 is the same as FIG. 1 except that a selection unit 10, a correction residue fitting processing unit 14, and a correction term calculation unit 16 are further added to the control computer. Each function of the correction residue fitting processing unit 14 and the correction term calculation unit 16 may be configured by software such as a program. Alternatively, such functions may be configured by hardware such as an electronic circuit. In addition to the above alternatives, these alternatives may be combined. The second embodiment is the same as the first embodiment except for content specifically described below.

Figure 8:
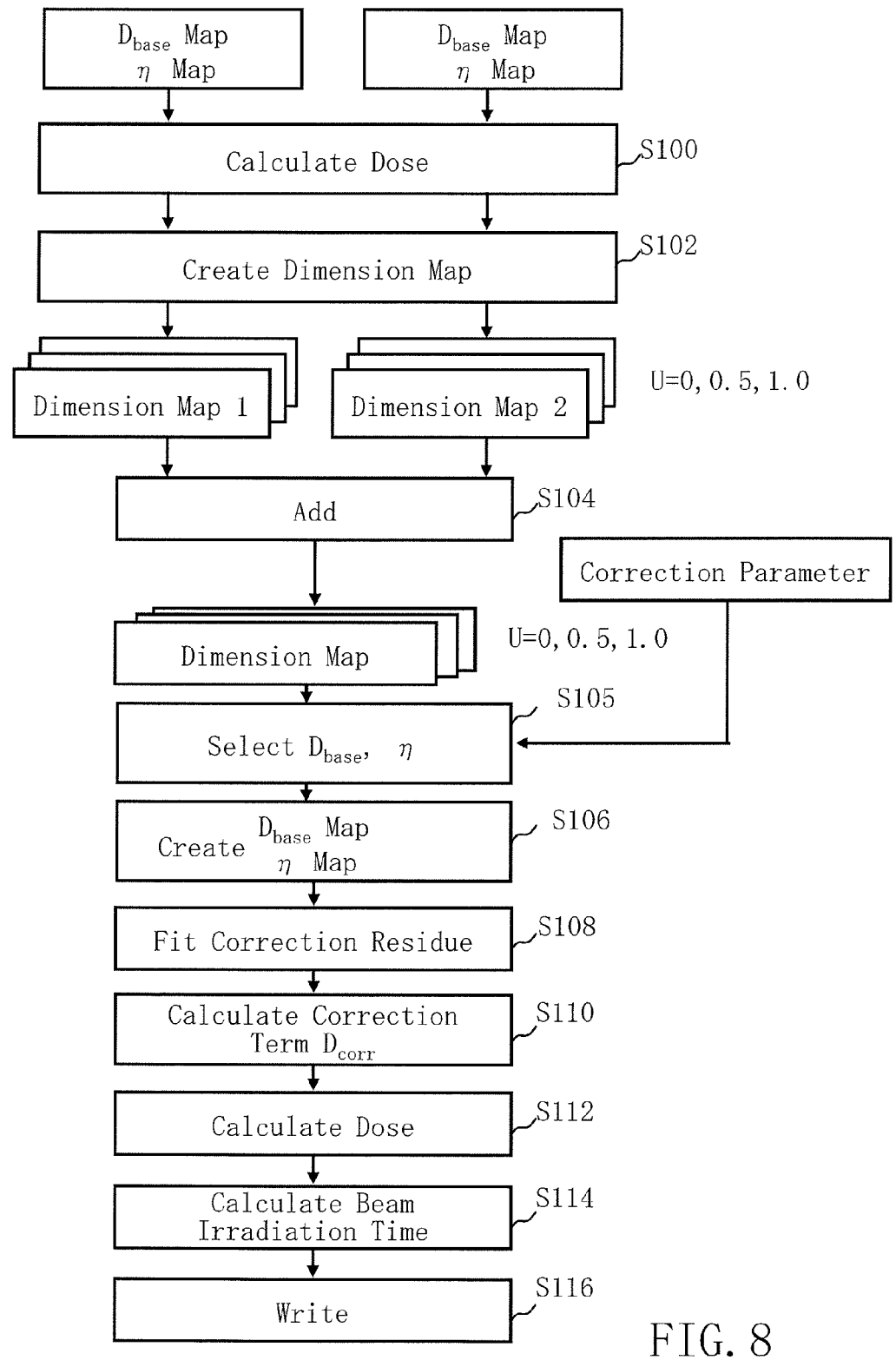
FIG. 8 is a flowchart showing principal portion processes of the writing method according to the second embodiment.

FIG. 8 is a flowchart showing principal portion processes of the writing method according to the second embodiment. In FIG. 8, the writing method according to the second embodiment is the same as in FIG. 2 except that the dimension map created in the dimension map creation process (S102) and the dimension map created after addition in the addition process (S104) are different, a proximity effect correction coefficient η/base dose $D_{base}$ selection process (S105) is added between the addition process (S104) and the proximity effect correction coefficient η/base dose $D_{base}$ map creation process (S106), and further a correction residue fitting process (S108) and a correction term calculation process (S110) are added between the proximity effect correction coefficient η/base dose $D_{base}$ map creation process (S106) and the dose calculating process (S112).

The dose calculating process (S100) is the same as in the first embodiment.

As the dimension map creation process (S102), the dimension map creation unit 52 creates dimension maps of pattern in a plurality of proximity effect densities for each set by using the calculated dose map (first dose map). That is, for example, in addition to the dimension map in the proximity effect density U(x)=0.5, a dimension map in the proximity effect density U(x)=0 and a dimension map in the proximity effect density U(x)=1 are created for each set.

The dimension map creation unit 52 calculates the dimension of pattern corresponding to the dose in each calculated position by referring to the correlation data between the pattern dimension CD and the dose D shown in FIG. 3. Then, the dimension map creation unit 52 creates dimension maps of pattern for each set. A plurality of dimension maps 1, 2 corresponding to the plurality of set data and depending on the proximity effect density U(x) can be created by the processes described above.

As the addition process (S104), the adder 54 adds dimensions of all sets for each position of the dimension map for each proximity effect density U(x) by using the plurality of dimension maps having different proximity effect densities U(x) of each set. According to the second embodiment, higher precision can be achieved than in the first embodiment by converting such parameters into dimensions for each proximity effect density U(x).

As the proximity effect correction coefficient η/base dose $D_{base}$ selection process (S105), the selection unit 10 selects a set of the proximity effect correction coefficient η and the base dose $D_{base}$ with which dimensional errors of pattern are corrected for a part of proximity effect densities and correction residues of dimensional errors of pattern are generated for the remaining proximity effect densities by using a plurality of added dimensional maps after being added and having mutually different proximity effect densities U(x). The selection unit 10 selects a set of the proximity effect correction coefficient η and the base dose $D_{base}$ with which dimensional errors of pattern are corrected for a part of proximity effect densities U(x) and dimensional fluctuation amounts $\delta_0$, $\delta_{100}$ to be correction residues of dimensional errors of pattern are generated for the remaining proximity effect densities U(x) when each map position of the pattern dimension map 40 is written to with the dose D correcting dimensional errors calculated by using the proximity effect correction coefficient $\eta$ and the base dose $D_{base}$ and obtained by a dose function.

Figure 9:
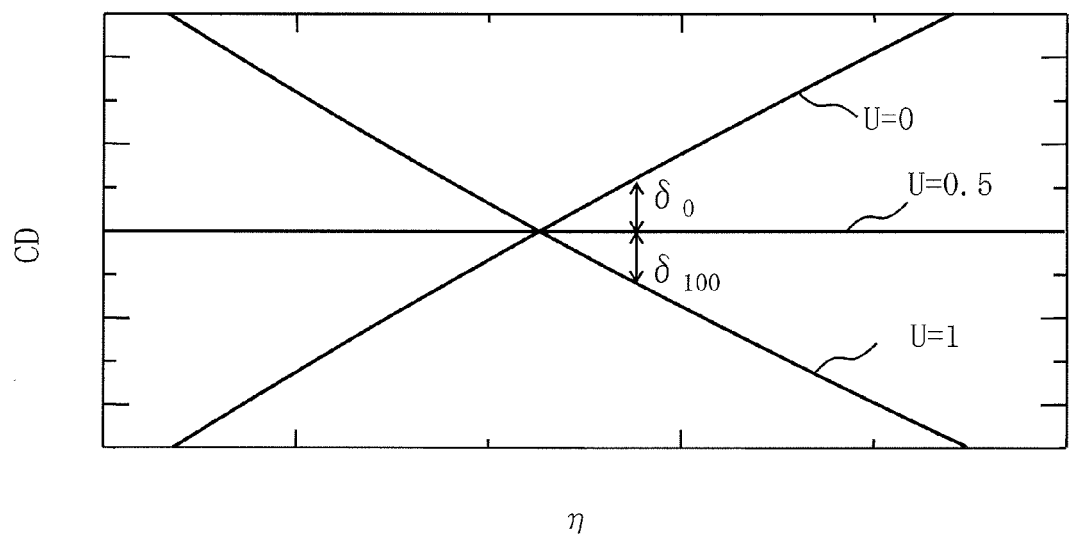
FIG. 9 is a graph showing an example of the correlation data between the pattern dimension CD and the proximity effect correction coefficient η according to the second embodiment.

FIG. 9 is a graph showing an example of the correlation data between the pattern dimension CD and the proximity effect correction coefficient $\eta$ in the second embodiment. The vertical axis of the graph represents the pattern dimension CD and the horizontal axis represents the proximity effect correction coefficient $\eta$. Here, the proximity effect density U(x) of 50% is set as the reference proximity effect density and the correlation between the proximity effect correction coefficient $\eta$ and the base dose $D_{base}$ is such that the pattern dimension CD becomes constant in the reference proximity effect density and thus, the pattern dimension CD is constant when the proximity effect density U(x)=0.5. Here, correlation data of the pattern dimension CD depending on the proximity effect correction coefficient $\eta$ is further calculated for the remaining proximity effect densities U(x). As shown in FIG. 9, the pattern dimension CD depending on the proximity effect correction coefficient $\eta$ changes in the proximity effect density U(x) other than 50%, which is set as the reference proximity effect density. In FIG. 9, a dimensional fluctuation amount $\delta$ of the pattern dimension CD depending on the proximity effect correction coefficient $\eta$ in the proximity effect density other than the reference proximity effect density is shown and $\delta_0$ is the dimensional fluctuation amount when the proximity effect density U(x)=0 and $\delta_{100}$ is the dimensional fluctuation amount when the proximity effect density U(x)=1. Next, correction parameters below are created by using the above correlation data.

FIG. 10 is a diagram showing an example of the correlation data among the base dose, the proximity effect correction coefficient, the pattern dimension when U(x)=0.5, and a dimensional fluctuation amount when U(x) is other than 0.5 in the second embodiment. As described above, one of the plurality of proximity effect densities U(x) is set as the reference proximity effect density and the set of the proximity effect correction coefficient $\eta$ and the base dose $D_{base}$ is correlated so that a desired pattern dimension is obtained in the reference proximity effect density. FIG. 10 shows correction parameters 30 to be correlation data among a plurality of sets of the proximity effect correction coefficient $\eta$ and the base dose $D_{base}$, the pattern dimensions CD obtained for the plurality of sets when the proximity effect density U(x)=0.5, and the dimensional fluctuation amounts $\delta_0$, $\delta_{100}$ for the plurality of sets in the remaining proximity effect densities. In the correction parameters 30 shown in FIG. 10, for example, the set of the proximity effect correction coefficient $\eta$ and the base dose $D_{base}$ is made variable for each pattern dimension CD to show the dimensional fluctuation amounts $\delta_0$, $\delta_{100}$ in each case. Such correction parameters are also stored in the storage device 144.

As shown in FIG. 9, sets of the proximity effect correction coefficient $\eta$ and the base dose $D_{base}$ are configured so that the pattern dimension CD becomes constant when the proximity effect density U(x)=0.5. Thus, unless one proximity effect correction coefficient $\eta$ that generates the desired pattern dimension CD for all proximity effect densities U(x) is selected, a correction residue of the proximity effect correction will be generated under conditions of no loading effect when the proximity effect density U(x) is other than 0.5. In the second embodiment, one proximity effect correction coefficient $\eta$ that generates the desired pattern dimension CD for all proximity effect densities U(x) is consciously not selected and instead, the proximity effect correction coefficient $\eta$ is selected by shifting the coefficient $\eta$. As a result, if the proximity effect density U(x)=0.5, the desired dimension is obtained when the relevant distribution position is written to with the dose D obtained from the dose function by canceling out the loading effect to correct a dimensional error of the pattern dimension. If the proximity effect densities U(x)=0, 100, by contrast, when the relevant distribution position is written to with the dose D obtained from the dose function, a correction residue may be generated in the dimensional error of the pattern dimension. Next, the selection technique will be described more specifically.

Figure 11A:
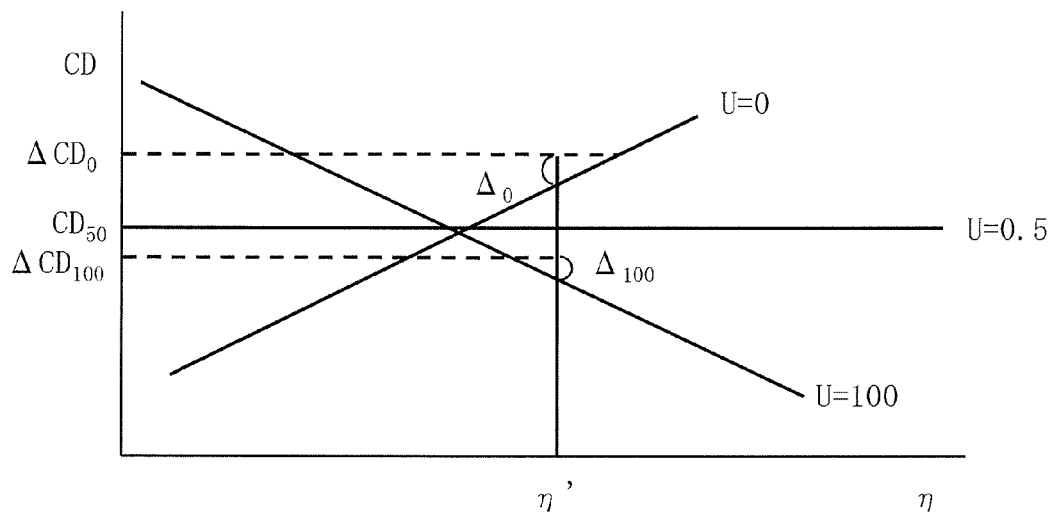
FIGS. 11A and 11B are conceptual diagrams for explaining a technique to select a set of the proximity effect correction coefficient and the base dose according to the first embodiment.
Figure 11B:
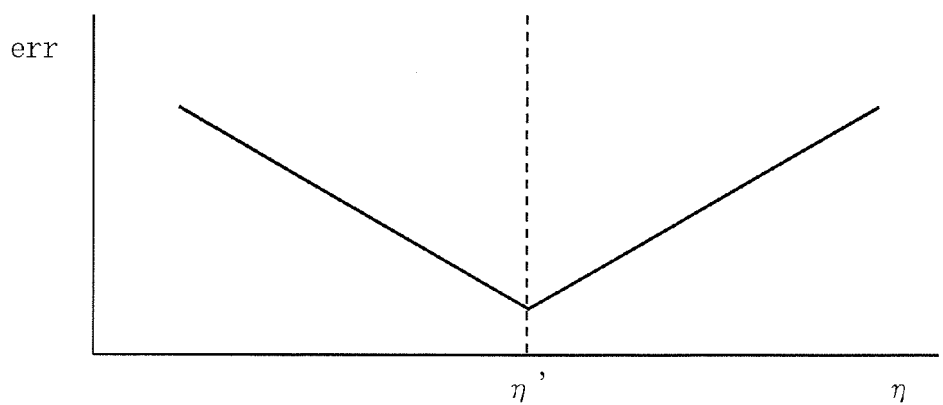

FIGS. 11A and 11B are conceptual diagrams for explaining a technique to select a set of the proximity effect correction coefficient and the base dose in the first embodiment. The pattern dimension CD in each proximity effect density U(x) is read for each position of the pattern dimension map 40. First, as shown in FIG. 11A, a set of the proximity effect correction coefficient $\eta$ and the base dose $D_{base}$ that generates the pattern dimension CD in the proximity effect density U(x)=0.5 to be the reference proximity effect density is assumed. Next, an absolute value $\Delta_0$ of a difference between a dimensional error $\Delta CD_0$ of the pattern dimension defined in the pattern dimension map 40 when the proximity effect density U(x)=0 from the pattern dimension when U(x)=0.5 and a pattern dimension fluctuation amount $\delta_0$ when written with the dose D obtained for the relevant set when the proximity effect density U(x)=0 is calculated. The absolute value $\Delta_0$ becomes a correction residue when the proximity effect density U(x)=0. Similarly, an absolute value $\Delta_{100}$ of a difference between a dimensional error $\Delta CD_{100}$ of the pattern dimension defined in the pattern dimension map 40 when the proximity effect density U(x)=1 from the pattern dimension when U(x)=0.5 and a pattern dimension fluctuation amount $\delta_{100}$ when written with the dose D obtained for the relevant set when the proximity effect density U(x)=1 is calculated. The absolute value $\Delta_{100}$ becomes a correction residue when the proximity effect density U(x)=1. Then, as shown in Formula (3) below, both terms are added.

$$\Delta_{err} = |CD_0(\eta) - \delta_0| + |CD_{100}(\eta) - \delta_{100}| \quad (3)$$

Then, as shown in FIG. 11B, the selection unit 10 selects a set of the proximity effect correction coefficient $\eta$ and the base dose $D_{base}$ that minimizes $\Delta err$ shown in Formula (3) for each distribution position of the pattern dimension map 40 by referring to the correction parameters 30. In other words, the selection unit 10 selects a set of the proximity effect correction coefficient $\eta$ and the base dose $D_{base}$ that makes a correction residue smaller.

Then, as the proximity effect correction coefficient $\eta$/base dose $D_{base}$ map creation process (S106), the proximity effect correction coefficient $\eta$/base dose $D_{base}$ map creation unit 12 creates a proximity effect correction coefficient $\eta$ map and a base dose $D_{base}$ map depending on each writing position corresponding to map positions (each distribution position of the pattern dimension map 40) by using the set of the proximity effect correction coefficient $\eta$ and a base dose $D_{base}$ selected for each position. Here, the proximity effect correction coefficient $\eta$/base dose $D_{base}$ map creation unit 12 creates both of the proximity effect correction coefficient map and base dose map, but the creation function may be divided into a proximity effect correction coefficient $\eta$ map creation unit and a base dose $D_{base}$ map creation unit.

With the above configuration, the proximity effect correction coefficient $\eta$ map and the base dose $D_{base}$ map capable of correcting entire dimensional fluctuations based on a plurality of phenomena such as dimensional fluctuations caused by the loading effect during development and dimensional fluctuations caused by the loading effect during etching without distinguishing the phenomena can be created from the pattern dimension map for each proximity effect density U(x). Then, the proximity effect can also be corrected at the same time for the proximity effect density U(x)=0.5. However, the correction residue remains for the proximity effect density U(x) other than 0.5 and thus, a correction term is provided as described below.

Figure 12A:
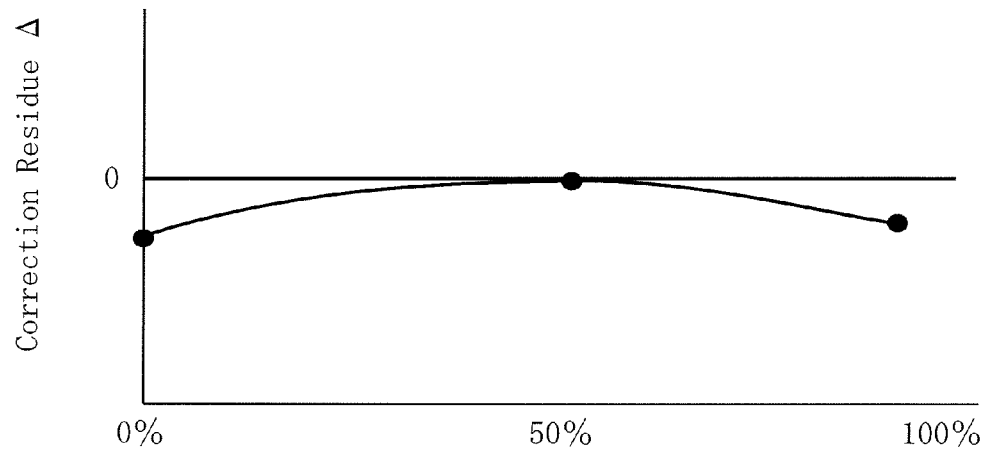
FIGS. 12A and 12B are conceptual diagrams for explaining the technique to calculate a correction term according to the second embodiment.
Figure 12B:
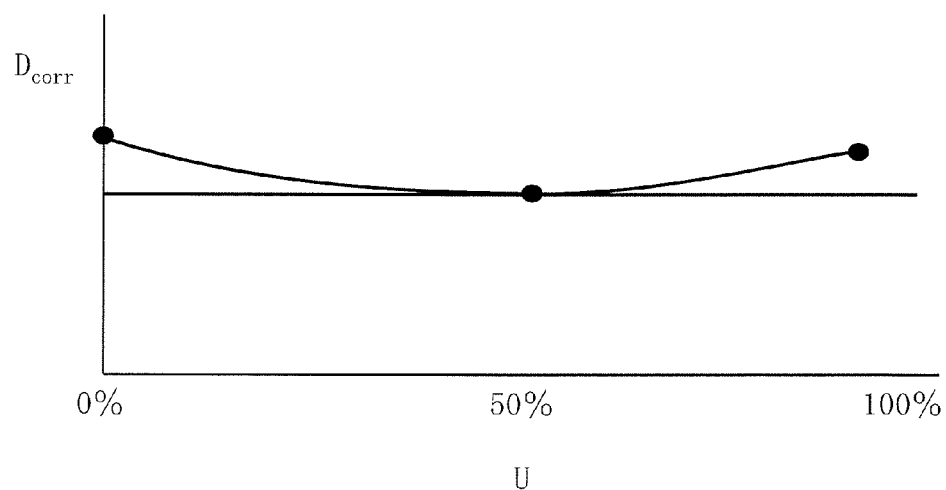

FIGS. 12A and 12B are conceptual diagrams for explaining the technique to calculate a correction term in the second embodiment. In FIG. 12A, the vertical axis of the graph represents a correction residue Δ and the horizontal axis represents the proximity effect density U(x). In FIG. 12B, the vertical axis of the graph represents a correction term $D_{corr}$ and the horizontal axis represents the proximity effect density U(x).

First, as the correction residue fitting process (S108), as shown in FIG. 12A, the correction residue fitting processing unit 14 calculates an approximate expression by fitting the correction residue Δ for each proximity effect density U(x) using a predetermined function.

Then, as the correction term calculation process (S110), the correction term calculation unit 16 calculates the correction term $D_{corr}$ that corrects the correction residue Δ depending on the proximity effect density U(x) for each map position. Here, the function of the correction term $D_{corr}$ may be set so that the correction residue Δ depending on the proximity effect density U(x) obtained from the approximate expression created in the correction residue fitting process (S108) is corrected.

As the dose calculating process (S112), the dose calculating unit 18 calculates the dose D by using the selected set of the proximity effect correction coefficient η and the base dose $D_{base}$ and the correction term $D_{corr}$ for each map position. The dose calculating unit 18 calculates a dose map (second dose map) in each position in the proximity effect density U(x) obtained from write data by using the created set of the proximity effect correction coefficient map and the base dose map. The dose D is defined by Formula (4) (dose function) below.

$$D(X,U) = D_{base}(x) D_p(\eta(x), U(x)) D_{corr}(x, U(x)) \quad (4)$$

As shown in Formula (4), the dose D(x, U) in the second embodiment can be defined by a formula that multiplies a product of the base dose $D_{base}$ (x) and the proximity effect-corrected dose Dp (η(x), U(x)) depending on the proximity effect correction coefficient η(x) and the proximity effect density U(x) further by the correction term $D_{corr}$(x, U(x)) depending on the position x and the proximity effect density U(x).

By calculating the dose D as described above, entire dimensional fluctuations based on a plurality of phenomena such as dimensional fluctuations caused by the loading effect during development and dimensional fluctuations caused by the loading effect during etching can be corrected without distinguishing the phenomena while also correcting the proximity effect. Moreover, by increasing conditions of the proximity effect density U(x), precision of the dimension map and the set of the proximity effect correction coefficient η and the base dose $D_{base}$ can further be improved. A case where it is necessary to correct η such as changing η for each of a plurality of phenomena according to a conventional method can also be handled. Furthermore, correction precision can be improved by introducing the correction term depending on the proximity effect density.

The dose calculating unit 18 may calculate a value obtained by further multiplying each value of the dose map calculated by using the created set of the proximity effect correction coefficient map and the base dose map and the correction term $D_{corr}$ by a correction coefficient of the fogging effect defined for each map position as the dose map (second dose map) here.

The beam irradiation time calculating process (S114) and the subsequent process are the same as those in the first embodiment.

Figures 13A, 13B, 13C:
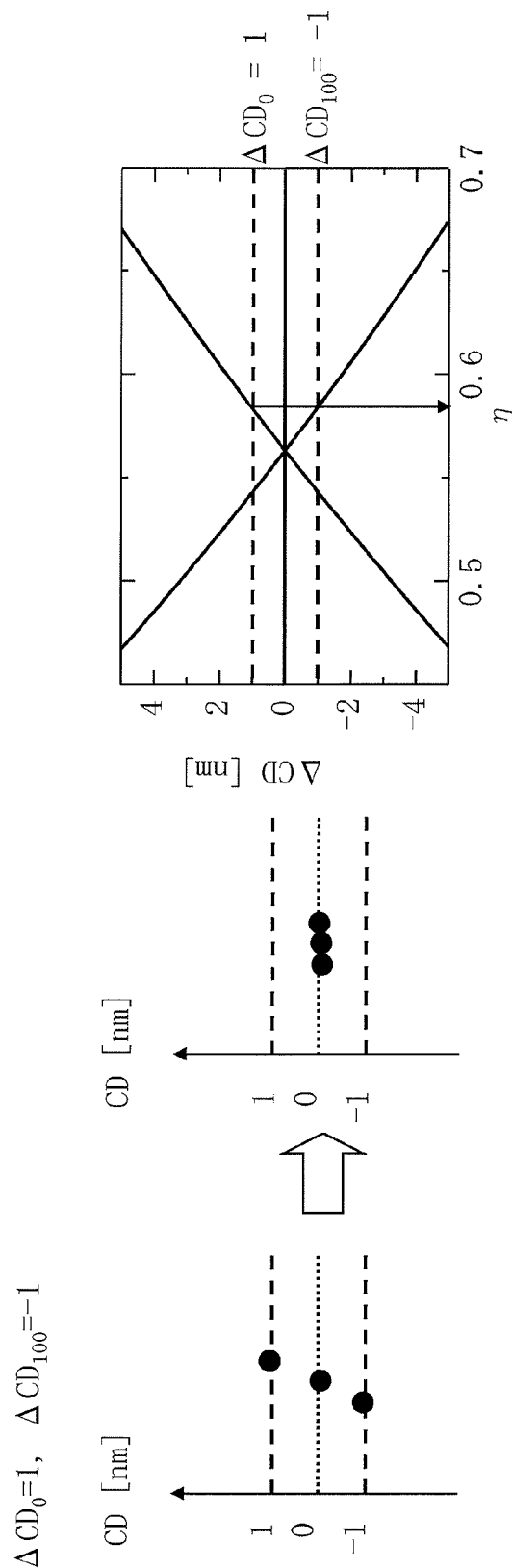
FIGS. 13A to 13C are diagrams showing an example of a dose correction according to the second embodiment.

FIGS. 13A to 13C are diagrams showing an example of the dose correction in the second embodiment. FIG. 13A shows a case where the dimensional error $\Delta CD_0$ of the pattern dimension defined in the pattern dimension map 40 when the proximity effect density U(x)=0, 1 from the pattern dimension when U(x)=0.5 is, for example, 1 nm and $\Delta CD_{100}$ is, for example, −1 nm. FIG. 13C shows an example in such a case of the correlation between the pattern dimension CD and the proximity effect correction coefficient η. In the example of the correlation in FIG. 10C, the proximity effect correction coefficient η that generates $\delta_0$=1 and $\delta_{100}$=−1 is present. In this example, as shown in FIG. 13B, dimensional errors can be corrected without generating any correction residue by selecting the above proximity effect correction coefficient η. Thus, the correction term $D_{corr}$=1 can be set.

FIGS. 14A to 14C are diagrams showing another example of the dose correction in the second embodiment. FIG. 14A shows a case where the dimensional error $\Delta CD_0$ of the pattern dimension defined in the pattern dimension map 40 when the proximity effect density U(x)=0, 1 from the pattern dimension when U(x)=0.5 is, for example, 1 nm and $\Delta CD_{100}$ is, for example, 0 nm. In such a case, the proximity effect correction coefficient η that generates $\delta_0$=1 and $\delta_{100}$=0 is not present in the example of the correlation in FIG. 14C. Thus, as shown in FIG. 14B, for example, the proximity effect correction coefficient η that generates the correction residue of −0.5 nm for both is selected. By making such a selection, a respective correction to some extent can be made, though not complete, when the proximity effect density U(x)=0, 1. In the second embodiment, the correction residue can also be corrected by using the correction term $D_{corr}$.

Figures 15A, 15B:
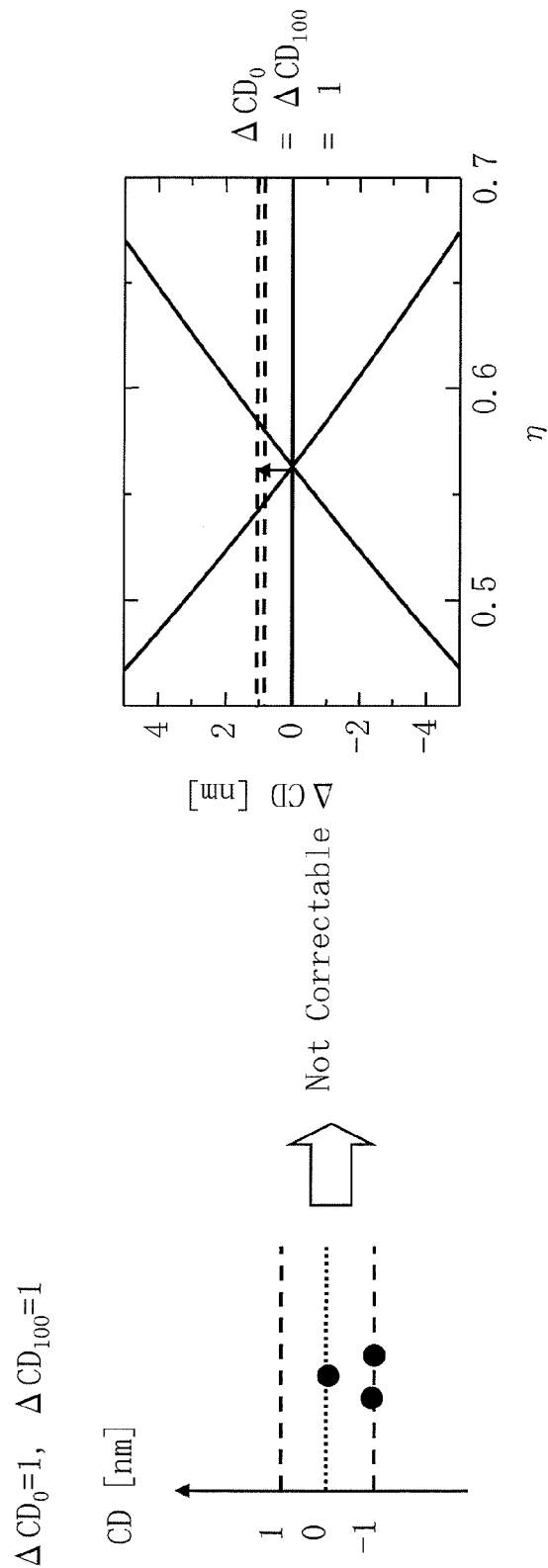
FIGS. 15A and 15B are diagrams showing still another example of the dose correction according to the second embodiment.

FIGS. 15A and 15B are diagrams showing still another example of the dose correction in the second embodiment. FIG. 15A shows a case where the dimensional error $\Delta CD_0$ of the pattern dimension defined in the pattern dimension map 40 when the proximity effect density U(x)=0, 1 from the pattern dimension when U(x)=0.5 is, for example, 1 nm and $\Delta CD_{100}$ is, for example, 1 nm. In such a case, the proximity effect correction coefficient η that generates $\delta_0$=1 and $\delta_{100}$=1 is not present in the example of the correlation in FIG. 15B. Dimensional fluctuations when the proximity effect density U(x)=0, 1 act in the direction of the opposite side and thus, it is difficult to correct both at the same time according to a conventional method. According to the second embodiment, by contrast, corrections can be made also in such a case by using the correction term $D_{corr}$.

Third Embodiment

According to the first and second embodiments, a plurality of set data including a set of a proximity effect correction coefficient η map and a base dose $D_{base}$ map is input into the writing apparatus 100 from the user side, but the present invention is not limited to this. In the third embodiment, further a case where data in a stage before creating a proximity effect correction coefficient η map and a base dose $D_{base}$ map is used as input data will be described. Some users may be assumed to create set data including correlation data between a pattern area density $\rho_L$ and the proximity effect correction coefficient η and correlation data between the pattern area density $\rho_L$ and the base dose $D_{base}$. Thus, in the third embodiment, a configuration enabling the writing apparatus 100 to handle even when the user creates the above set data for each of phenomena of dimensional fluctuations and inputs the set data to the writing apparatus 100.

Figure 16:
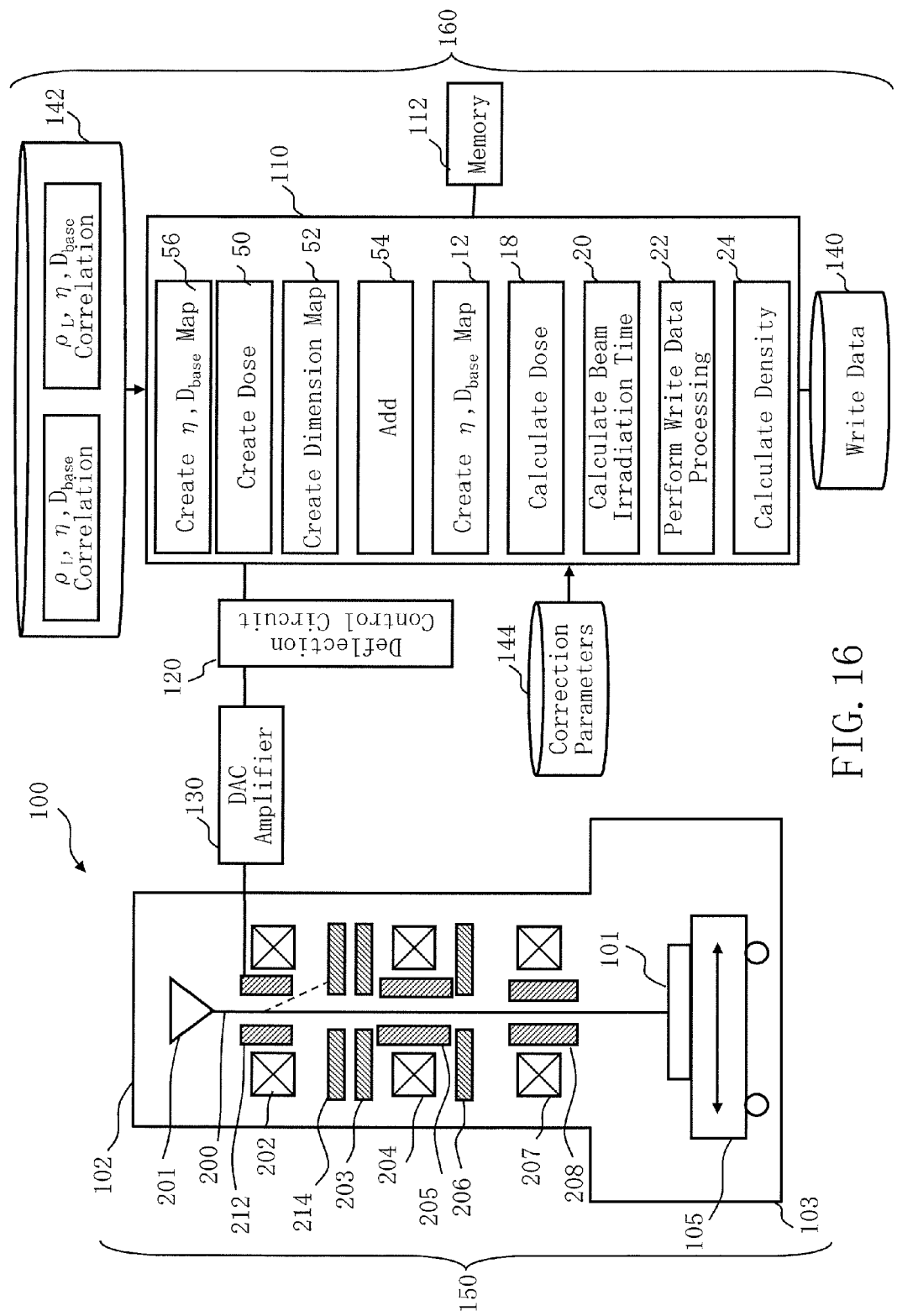
FIG. 16 is a conceptual diagram showing the configuration of a writing apparatus according to a third embodiment.

FIG. 16 is a conceptual diagram showing the configuration of the writing apparatus according to the third embodiment. FIG. 16 is the same as FIG. 1 except that a proximity effect correction coefficient η/base dose $D_{base}$ map creation unit 56 is further added to the control computer and input data stored in the storage device 142 is a plurality of set data correlated by the pattern area density $\rho_L$, the proximity effect correction coefficient η, and the base dose $D_{base}$. The function of the proximity effect correction coefficient η/base dose $D_{base}$ map creation unit 56 may be configured by software such as a program. Alternatively, such a function may be configured by hardware such as an electronic circuit. In addition to the above alternatives, these alternatives may be combined. The third embodiment is the same as the first embodiment except for content specifically described below.

First, correlation information among the pattern area density (area ratio) $\rho_L$, the proximity effect correction coefficient η, and the base dose $D_{base}$ is created for each of a plurality of phenomena causing dimensional fluctuations in a mask plane when fabricating a mask. Then, a plurality of set data created on the user side and correlated by the pattern area density $\rho_L$, the proximity effect correction coefficient η, and the base dose $D_{base}$ is input from outside the writing apparatus 100 and stored in the storage device 142. The plurality of set data includes a set data to correct dimensional fluctuations of patterns caused by the loading effect when the target object 101 is developed and a set data to correct dimensional fluctuations of patterns caused by the loading effect when a light-shielding film of chrome (Cr) or the like is etched after the development of the target object 101. Correlation information among the pattern area ratio, the proximity effect correction coefficient, and the base dose is input for each of a plurality of phenomena causing dimensional fluctuations in a mask plane during mask writing and stored.

The density calculation unit 24 divides a write region into mesh regions and calculates the pattern area density $\rho_L$ in each mesh by referring to write data. The mesh size is suitably of size of about 1/10 of the range of influence of the loading effect to be used for correcting the loading effect. For example, the mesh is suitably a mesh of 1 mm per side.

As the proximity effect correction coefficient η/base dose $D_{base}$ map creation process, the proximity effect correction coefficient η/base dose $D_{base}$ map creation unit 56 (first set map creation unit) reads each piece of correlation information to create a set of the proximity effect correction coefficient map and the base dose map for each phenomenon to correct the phenomenon. Here, the corresponding proximity effect correction coefficient η and base dose $D_{base}$ are determined from the pattern area density $\rho_L$ in each position obtained from write data to be actually written by the writing apparatus 100 by referring to correlation data among the pattern area density $\rho_L$, the proximity effect correction coefficient η, and the base dose $D_{base}$ created on the user side.

Then, as the dose calculating process (S100), the dose calculating unit 50 (first dose calculating unit) calculates a dose map (first dose map) for each set. Each subsequent process is the same as that in the first embodiment.

According to the third embodiment, as described above, even if correlation information among the pattern area ratio, proximity effect correction coefficient, and base dose is input for each phenomenon, such information can be combined in the apparatus. Then, even if content of input data is different from phenomenon to phenomenon, the input data can be combined in the writing apparatus 100 to calculate the appropriate dose D.

Fourth Embodiment

In the fourth embodiment, an apparatus and a method capable of correcting both of dimensional fluctuations caused by the loading effect during development and dimensional fluctuations caused by the loading effect during etching while correcting the proximity effect will be described.

Figure 17:
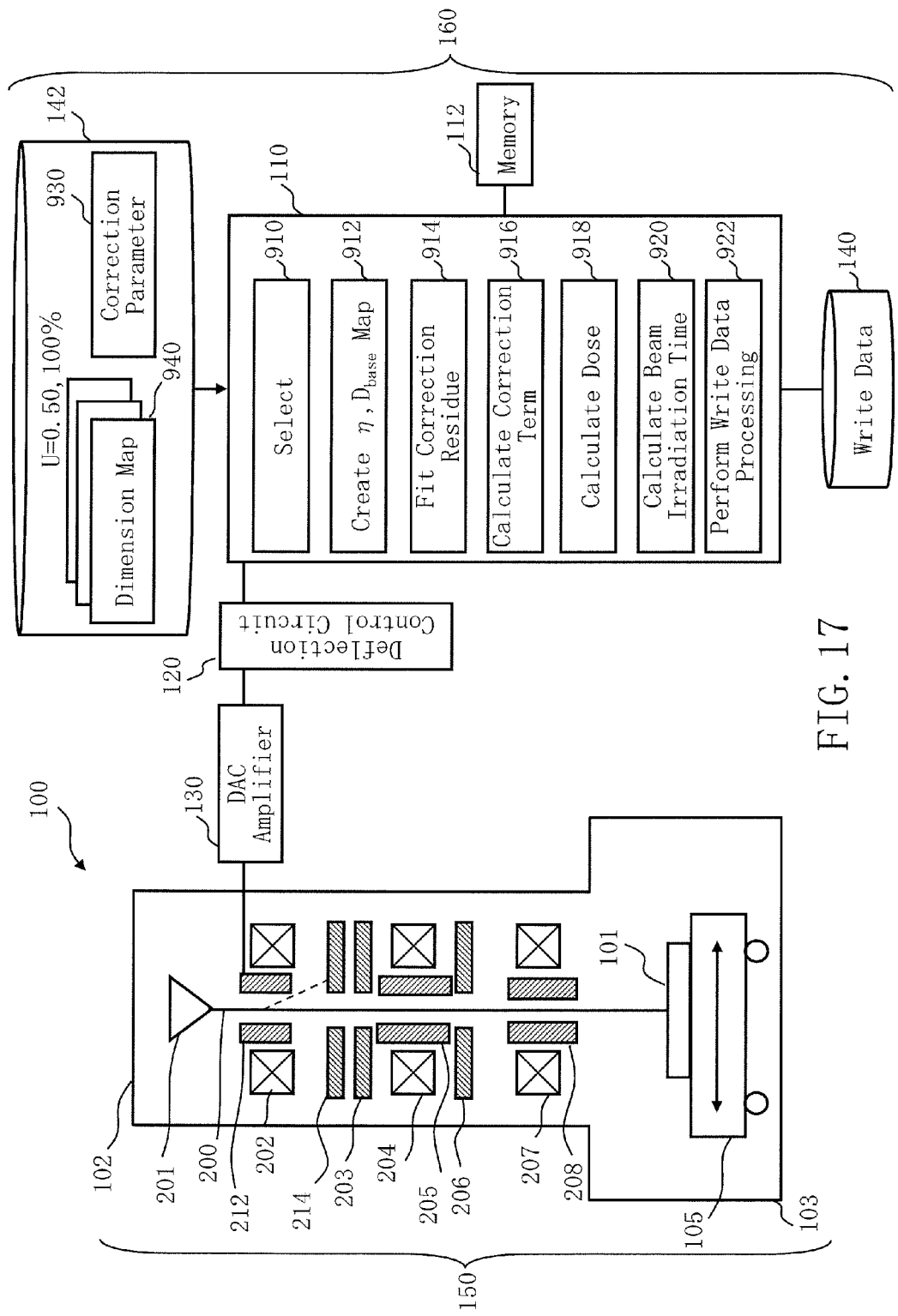
FIG. 17 is a conceptual diagram showing the configuration of a writing apparatus according to a fourth embodiment.

FIG. 17 is a conceptual diagram showing the configuration of the writing apparatus according to the fourth embodiment. In FIG. 17, the writing apparatus 100 includes the pattern writing unit 150 and the control unit 160. The writing apparatus 100 is an example of the charged particle beam writing apparatus. Particularly, the writing apparatus 100 is an example of the variable-shaped (VSB type) writing apparatus. The pattern writing unit 150 includes the electron lens barrel 102 and the pattern writing chamber 103. In the electron lens barrel 102, the electron gun assembly 201, the illumination lens 202, the blanking deflector (blanker) 212, the blanking aperture plate 214, the first shaping aperture plate 203, the projection lens 204, the deflector 205, the second shaping aperture plate 206, the objective lens 207, and the deflector 208 are arranged. In the pattern writing chamber 103, the X-Y stage 105 capable of moving at least in the XY directions is arranged. On the X-Y stage 105, the target object 101 to be written to is placed. The target object 101 includes, for example, a mask for exposure and a silicon wafer to produce a semiconductor device. The mask includes mask blanks.

The control unit 160 includes the control computer 110, the memory 112, the deflection control circuit 120, the DAC (digital-analog converter) amplification unit 130 (deflection amplifier), and the storage devices 140, 142 such as magnetic disk drives. The control computer 110, the memory 112, the deflection control circuit 120, and the storage devices 140, 142 such as magnetic disk drives are connected to each other by a bus (not shown). The DAC amplification unit 130 is connected to the deflection control circuit 120. The DAC amplification unit 130 is connected to the blanking deflector 212.

A digital signal for blanking control is output from the deflection control circuit 120 to the DAC amplification unit 130. Then, the DAC amplification unit 130 converts the digital signal into an analog signal and amplifies the analog signal, which is then applied to the blanking deflector 212 as a deflection voltage. The electron beam 200 is deflected by the deflection voltage to form a beam for each shot.

In the control computer 110, a selection unit 910, a proximity effect correction coefficient η/base dose $D_{base}$ map creation unit 912, a correction residue fitting processing unit 914, a correction term calculation unit 916, a dose calculating unit 918, a beam irradiation time calculating unit 920, and a write data processing unit 922 are arranged. Each function of the selection unit 910, the proximity effect correction coefficient η/base dose $D_{base}$ map creation unit 912, the correction residue fitting processing unit 914, the correction term calculation unit 916, the dose calculating unit 918, the beam irradiation time calculating unit 920, and the write data processing unit 922 may be configured by software such as a program. Alternatively, such functions may be configured by hardware such as an electronic circuit. In addition to the above alternatives, these alternatives may be combined. Input data necessary for the control computer 110 or a calculating result is stored each time in the memory 112. Similarly, the deflection control circuit 120 may be configured as a computer operated by software such as a program or by hardware such as an electronic circuit. In addition to the above alternatives, these alternatives may be combined. Here, in FIG. 17, only the configuration needed to explain the fourth embodiment is shown. The writing apparatus 100 may generally include other necessary configurations as a matter of course. For example, it is needless to say that each DAC amplification unit for the deflector 205 and the deflector 208 are included.

Figure 18:
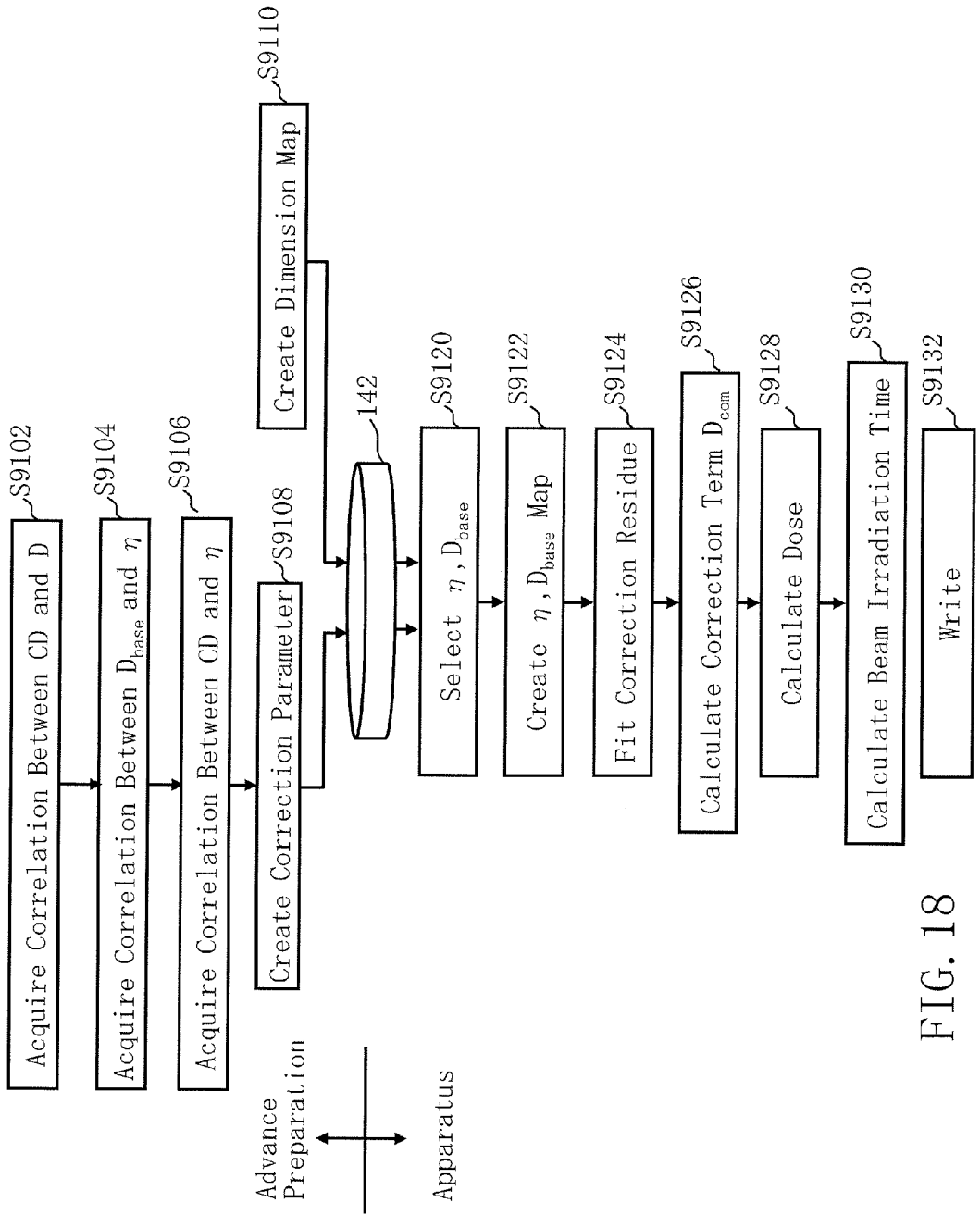
FIG. 18 is a flowchart showing principal portion processes of the writing method according to the fourth embodiment.

FIG. 18 is a flowchart showing principal portion processes of the writing method according to the fourth embodiment. In FIG. 18, as processes to be executed in advance before input into the writing apparatus 100, an acquisition process of correlation data between the pattern dimension CD and the dose D (S9102), an acquisition process of correlation data between the proximity effect correction coefficient η and the base dose $D_{base}$ (S9104), an acquisition process of correlation data between the pattern dimension CD and the proximity effect correction coefficient η (S9106), and a correction parameter creation process (S9108) are performed. Further, a dimension map creation process (S9110) is executed as a process to be executed in advance. Then, the writing method executed in the writing apparatus 100 according to the fourth embodiment executes a series of processes including a proximity effect correction coefficient η/base dose $D_{base}$ selection process (S9120), a proximity effect correction coefficient η/base dose $D_{base}$ map creation process (S9122), a correction residue fitting process (S9124), a correction term calculation process (S9126), a dose calculating process (S9128), a beam irradiation time calculating process (S9130), and a writing process (S9132).

First, as the acquisition process of correlation data between the pattern dimension CD and the dose D (S9102), correlation data between the pattern dimension CD and the dose D is acquired through experiment for each proximity effect density U. The proximity effect density U(x) is defined as a value obtained by integrating a convolution of the pattern area density ρ(x) in a proximity effect mesh with a distribution function g(x) over a range beyond the range of influence of the proximity effect. The proximity effect mesh is suitably of size of, for example, 1/10 of the range of influence of the proximity effect and the size of, for example, about 1 μm is suitable. The proximity effect density U(x) is defined by Formula (1) shown above. x is a vector indicating the position.

A graph showing an example of correlation data between the pattern dimension CD and the dose D in the fourth embodiment is like in FIG. 3. The vertical axis of the graph represents the pattern dimension CD and the horizontal axis represents the dose D logarithmically. Here, the correlation data is determined by experiments for each case of the proximity effect density U(x)=0 (0%), 0.5 (50%), and 1 (100%). The proximity effect density U(x)=0 means that there is actually no pattern and thus, the correlation data can approximately be determined by writing, for example, one line pattern for measurement in a state in which there is nothing therearound. Conversely, the proximity effect density U(x)=1 means that the entire mesh including the surroundings is filled with patterns and dimensions cannot be measured and thus, the correlation data can approximately be determined by writing, for example, one line pattern for measurement in a state in which the entire surroundings are filled with patterns. If a 1:1 line and space pattern is written by assuming the density of, for example, 50%, one mesh may contain only a line pattern and an adjacent mesh may contain only a space pattern because the mesh size is small. In such a case, the pattern area density ρ(x) becomes a density inside a mesh regardless of the surroundings thereof. By using the proximity effect density U(x), by contrast, the density of each mesh can be calculated to be 50%. The proximity effect density U(x) to be set is not limited to cases of 0%, 50%, and 100%. For example, three values of 10% or less, 50%, and 90% or more may suitably be used as the proximity effect density U(x). The number of cases of the proximity effect density U(x) is not limited to three and any other number of cases of the proximity effect density U(x) may be used for measurement. For example, four cases of the proximity effect density U(x) or more may be used for measurement.

Next, as the acquisition process of correlation data between the proximity effect correction coefficient η and the base dose $D_{base}$ (S9104), correlation data between the proximity effect correction coefficient η and the base dose $D_{base}$ is calculated by using the correlation data between CD and the dose D obtained by experiments.

A graph showing an example of correlation data between the proximity effect correction coefficient η and the base dose $D_{base}$ in the fourth embodiment is like in FIG. 4. The vertical axis of the graph represents the base dose $D_{base}$ and the horizontal axis represents the proximity effect correction coefficient η. Here, for example, the proximity effect density U(x) of 50% is set as the reference proximity effect density and correlation data between the proximity effect correction coefficient η and the base dose $D_{base}$ with which the pattern dimension CD becomes constant in the reference proximity effect density is calculated. The proximity effect correction coefficient η that fits the proximity effect correction well is present for each base dose $D_{base}$. The pattern dimension is made variable in advance to calculate correlation data for each pattern dimension.

Next, as the acquisition process of correlation data between the pattern dimension CD and the proximity effect correction coefficient η (S9106), correlation data between the pattern dimension CD and the proximity effect correction coefficient η is calculated by using the correlation data between the proximity effect correction coefficient η and the base dose $D_{base}$ obtained for each pattern dimension.

A graph showing an example of correlation data between the pattern dimension CD and the proximity effect correction coefficient η in the fourth embodiment is like in FIG. 9. The vertical axis of the graph represents the pattern dimension CD and the horizontal axis represents the proximity effect correction coefficient η. Here, correlation data of the pattern dimension CD depending on the proximity effect correction coefficient η is further calculated for the remaining proximity effect densities U(x). As shown in FIG. 5, the pattern dimension CD depending on the proximity effect correction coefficient η changes in the proximity effect density U(x) other than 50%, which is set as the reference proximity effect density. In FIG. 9, the dimensional fluctuation amount δ of the pattern dimension CD depending on the proximity effect correction coefficient η in the proximity effect density other than the reference proximity effect density is shown and $δ_0$ is the dimensional fluctuation amount when the proximity effect density U(x)=0 and $δ_{100}$ is the dimensional fluctuation amount when the proximity effect density U(x)=1.

Next, as the correction parameter creation process (S9108), correction parameters are created by using the above correlation data.

A diagram showing an example of the correlation data among the base dose, the proximity effect correction coefficient, the pattern dimension when U(x)=0.5, and the dimensional fluctuation amount when U(x) is other than 0.5 in the fourth embodiment is like in FIG. 10. As described above, one of the plurality of proximity effect densities U(x) is set as the reference proximity effect density and the set of the proximity effect correction coefficient η and the base dose $D_{base}$ is correlated so that a desired pattern dimension is obtained in the reference proximity effect density. FIG. 10 shows correction parameters 930 to be correlation data among a plurality of sets of the proximity effect correction coefficient η and the base dose $D_{base}$, the pattern dimensions CD obtained for the plurality of sets when the proximity effect density U(x)=0.5, and the dimensional fluctuation amounts $\delta_0$, $\delta_{100}$ for the plurality of sets in the remaining proximity effect densities. In the correction parameters 930 shown in FIG. 6, for example, the set of the proximity effect correction coefficient and the base dose $D_{base}$ is made variable for each pattern dimension CD to show the dimensional fluctuation amounts $\delta_0$, $\delta_{100}$ in each case.

Next, as the dimension map creation process (S9110), a dimension map depending on the position of the target object 101 is created for each proximity effect density U(x).

Figure 19A:
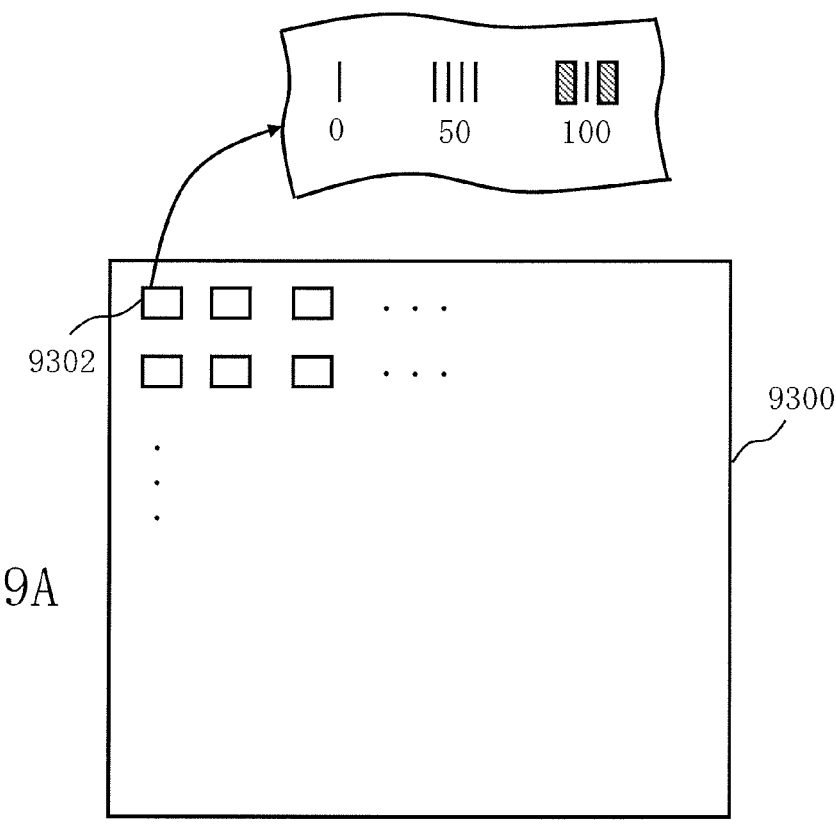
FIG. 19 is a conceptual diagram for explaining a creation method of a dimension map according to the fourth embodiment.
Figure 19B:
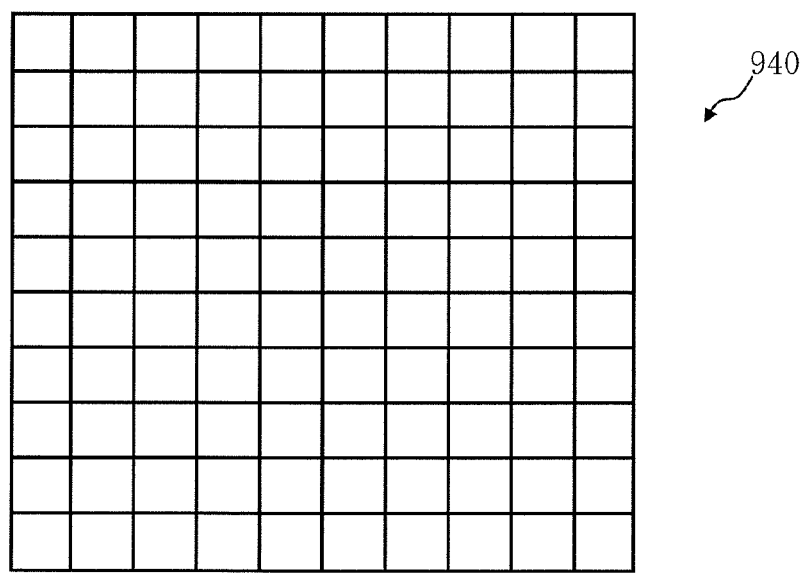
Figure 20:
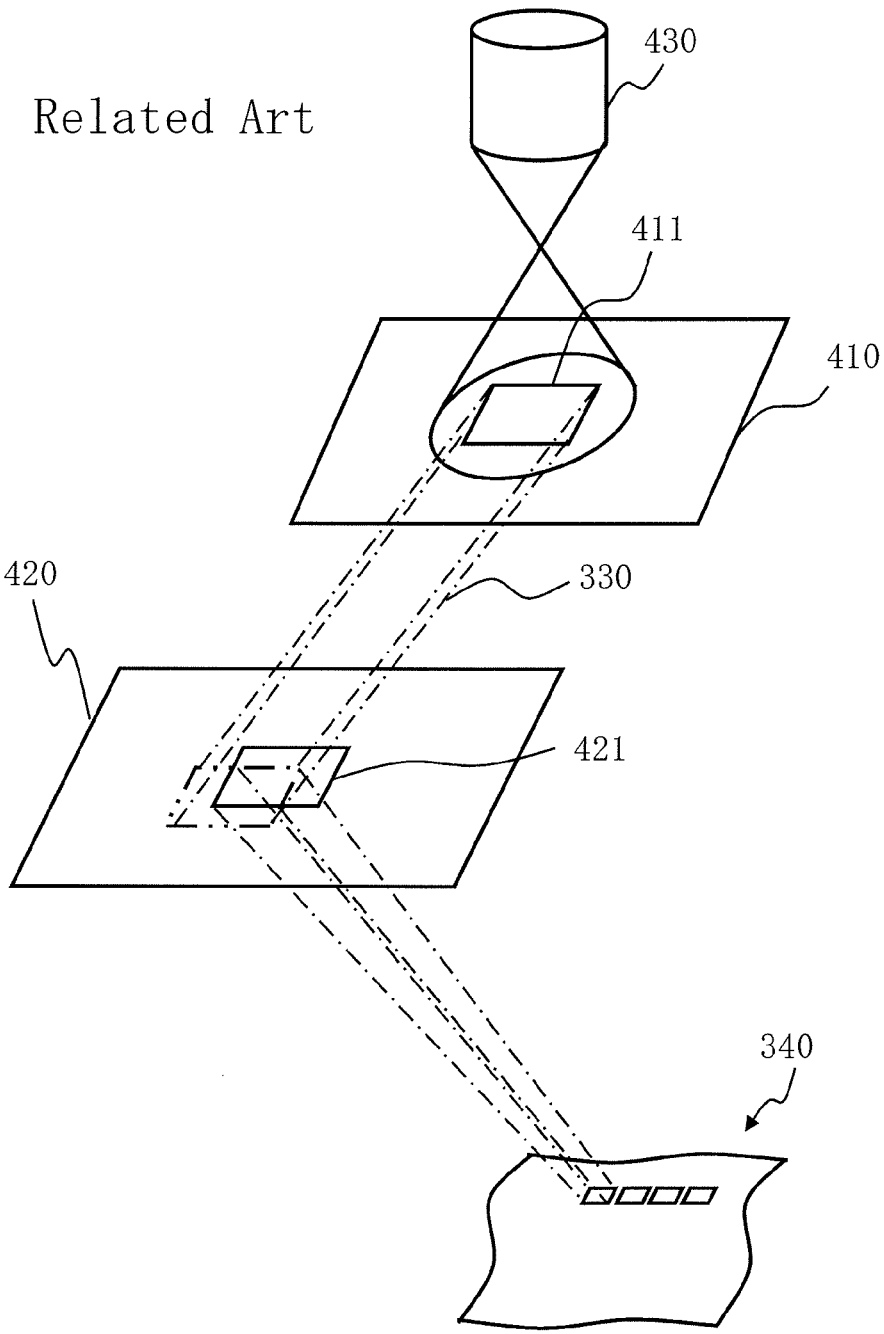
FIG. 20 is a conceptual diagram for describing an operation of a variable-shaped electron beam writing apparatus.

FIGS. 19A and 19B are conceptual diagrams for explaining the creation method of a dimension map in the fourth embodiment. In FIG. 19A, evaluation patterns 9302 are regularly formed on an evaluation substrate 9300 so that the evaluation patterns 9302 are distributed substantially over an entire surface of the evaluation substrate 9300. In each of the evaluation patterns 9302, patterns to be the proximity effect density U(x)=0.0.5, and 1 are arranged. After the evaluation patterns 9302 are written to the entire surface of the evaluation substrate 9300 coated with a resist by using the writing apparatus 100, the resist is developed and a chrome (Cr) film, for example, to be a light-shielding film of the groundwork is etched and further ashed. Then, the pattern dimension of each light-shielding film formed on the evaluation substrate 9300 is measured. Then, as shown in FIG. 19B, the pattern dimension map 40 defined by the measured pattern dimension being made depending on the position is created for each proximity effect density U(x). In this manner, data of a plurality of pattern dimension maps 940 of mutually different proximity effect densities showing the distribution of the pattern dimensions CD formed on the evaluation substrate 9300 when patterns are written to the evaluation substrate 9300 by making the proximity effect density U(x) variable is created. The measured pattern dimension contains both of dimensional fluctuations caused by the loading effect during development and dimensional fluctuations caused by the loading effect during etching. The mesh size of the pattern dimension map 940 is suitably of size of about 1/10 of the range of influence of the loading effect to be used for correcting the loading effect. For example, the mesh is suitably a mesh of 1 mm per side.

The correction parameters 930 and the pattern dimension map 940 for each proximity effect density U(x) are created as described above before starting to write by the writing apparatus 100. Each piece of data of the correction parameters 930 and the pattern dimension map 940 for each proximity effect density U(x) is input into the writing apparatus 100 from outside the writing apparatus 100 and stored in the storage device 142. Thus, the storage device 142 stores correlation data showing a plurality of sets of the proximity effect correction coefficient and base dose, pattern dimensions obtained for each of the plurality of sets in the reference proximity effect density, and dimensional fluctuation amounts for the plurality of sets in the remaining proximity effect densities. The correlation data is stored in one unit of the storage device 142 here, but the present embodiment is not limited to this and the correlation data may be divided and stored in a plurality of storage devices. Then, the data is used to write patterns by the writing apparatus 100.

In the writing apparatus 100, the write data processing unit 922 reads write data input from outside and stored in the storage device 140 from the storage device 140 and performs data conversion processing in a plurality of stages. Then, the write data processing unit 922 generates shot data specific to the writing apparatus by the data conversion processing in the plurality of stages. Then, writing processing is performed according to the shot data. The write data processing unit 922 reads the write data, calculates the pattern area density in each position, and further calculates the proximity effect density U(x) in each position.

As the proximity effect correction coefficient η/base dose $D_{base}$ selection process (S9120), the selection unit 910 selects a set of the proximity effect correction coefficient η and the base dose $D_{base}$ with which dimensional errors of pattern are corrected for a part of proximity effect densities U(x) and dimensional fluctuation amounts $\delta_0$, $\delta_{100}$ to be correction residues of dimensional errors of pattern are generated for the remaining proximity effect densities U(x) when each map position of the pattern dimension map 940 is written to with the dose D correcting dimensional errors calculated by using the proximity effect correction coefficient η and the base dose $D_{base}$ and obtained by a dose function. The dose function can be defined by the above Formula (2).

As shown in Formula (2), the dose D(x, U) can be defined as a product of the base dose $D_{base}$ (x) and the proximity effect-corrected dose Dp(η(x), U(x)) depending on the proximity effect correction coefficient η(x) and the proximity effect density U(x).

As shown in FIG. 9, sets of the proximity effect correction coefficient η and the base dose $D_{base}$ are configured so that the pattern dimension CD becomes constant when the proximity effect density U(x)=0.5. Thus, unless one proximity effect correction coefficient η that generates the desired pattern dimension CD for all proximity effect densities U(x) is selected, a correction residue of the proximity effect correction will be generated under conditions of no loading effect when the proximity effect density U(x) is other than 0.5. In the fourth embodiment, one proximity effect correction coefficient η that generates the desired pattern dimension CD for all proximity effect densities U(x) is consciously not selected and instead, the proximity effect correction coefficient η is selected by shifting the coefficient η. As a result, if the proximity effect density U(x)=0.5, the desired dimension is obtained when the relevant distribution position is written to with the dose D obtained from the dose function by canceling out the loading effect to correct a dimensional error of the pattern dimension. If the proximity effect densities U(x)=0, 1, by contrast, when the relevant distribution position is written to with the dose D obtained from the dose function, a correction residue will be generated in the dimensional error of the pattern dimension. Next, the selection technique will be described more specifically.

A conceptual diagram for explaining the technique to select a set of the proximity effect correction coefficient and the base dose in the fourth embodiment is like in FIGS. 11A and 11B. The pattern dimension CD in each proximity effect density U(x) is read for each position of the pattern dimension map 940. First, as shown in FIG. 11A, a set of the proximity effect correction coefficient η and the base dose $D_{base}$ that generates the pattern dimension CD in the proximity effect density U(x)=0.5 to be the reference proximity effect density is assumed. Next, the absolute value $\Delta_0$ of a difference between the dimensional error $\Delta CD_0$ of the pattern dimension defined in the pattern dimension map 940 when the proximity effect density U(x)=0 from the pattern dimension when U(x) =0.5 and the pattern dimension fluctuation amount $\delta_0$ when written with the dose D obtained for the relevant set when the proximity effect density U(x)=0 is calculated. The absolute value $\Delta_0$ becomes a correction residue when the proximity effect density U(x)=0. Similarly, the absolute value $\Delta_{100}$ of a difference between the dimensional error $\Delta CD_{100}$ of the pattern dimension defined in the pattern dimension map 940 when the proximity effect density U(x)=1 from the pattern dimension when U(x)=0.5 and the pattern dimension fluctuation amount $\delta_{100}$ when written with the dose D obtained for the relevant set when the proximity effect density U(x)=1 is calculated. The absolute value $\Delta_{100}$ becomes a correction residue when the proximity effect density U(x)=1. Then, as shown in Formula (3) above, both terms are added.

Then, as shown in FIG. 11B, the selection unit 910 selects a set of the proximity effect correction coefficient η and the base dose $D_{base}$ that minimizes Δerr shown in Formula (3) for each distribution position of the pattern dimension map 940 by referring to the correction parameters 930. In other words, the selection unit 910 selects a set of the proximity effect correction coefficient η and the base dose $D_{base}$ that makes a correction residue smaller.

Then, as the proximity effect correction coefficient η/base dose $D_{base}$ map creation process (S9122), the proximity effect correction coefficient η/base dose $D_{base}$ map creation unit 912 creates a proximity effect correction coefficient η map and a base dose $D_{base}$ map depending on each distribution position of the pattern dimension map 940 by using the set of the proximity effect correction coefficient η and a base dose $D_{base}$ selected for each position. Here, the proximity effect correction coefficient η/base dose $D_{base}$ map creation unit 912 creates both of the proximity effect correction coefficient map and base dose map, but the creation function may be divided into a proximity effect correction coefficient η map creation unit and a base dose $D_{base}$ map creation unit.

With the above configuration, the proximity effect correction coefficient η map and the base dose $D_{base}$ map capable of correcting entire dimensional fluctuations based on a plurality of phenomena such as dimensional fluctuations caused by the loading effect during development and dimensional fluctuations caused by the loading effect during etching without distinguishing the phenomena can be created from the pattern dimension map for each proximity effect density U(x). Then, the proximity effect can also be corrected at the same time for the proximity effect density U(x)=0.5. However, the correction residue remains for the proximity effect density U(x) other than 0.5 and thus, a correction term is provided as described below.

A conceptual diagram for explaining the technique to calculate a correction term in the fourth embodiment is like in FIGS. 12A and 12B. In FIG. 12A, the vertical axis of the graph represents the correction residue Δ and the horizontal axis represents the proximity effect density U(x). In FIG. 12B, the vertical axis of the graph represents the correction term $D_{corr}$ and the horizontal axis represents the proximity effect density U(x).

First, as the correction residue fitting process (S9124), as shown in FIG. 12A, the correction residue fitting processing unit 914 calculates an approximate expression by fitting the correction residue Δ for each proximity effect density U(x) using a predetermined function.

Then, as the correction term calculation process (S9126), the correction term calculation unit 916 calculates the correction term $D_{corr}$ that corrects the correction residue Δ depending on the proximity effect density U(x) for each map position. Here, the function of the correction term $D_{corr}$ may be set so that the correction residue Δ depending on the proximity effect density U(x) obtained from the approximate expression created in the correction residue fitting process (S9124) is corrected.

As the dose calculating process (S9128), the dose calculating unit 918 calculates the dose D by using the selected set of the proximity effect correction coefficient η and the base dose $D_{base}$ and the correction term $D_{corr}$ for each map position. The dose D is defined by the above Formula (4).

As shown in Formula (4), the dose D(x, U) in the fourth embodiment can be defined by a formula that multiplies a product of the base dose $D_{base}$ (x) and the proximity effect-corrected dose Dp(η(x), U(x)) depending on the proximity effect correction coefficient η(x) and the proximity effect density U(x) further by the correction term $D_{corr}$(x, U(x)) depending on the position x and the proximity effect density U(x).

By calculating the dose D as described above, entire dimensional fluctuations based on a plurality of phenomena such as dimensional fluctuations caused by the loading effect during development and dimensional fluctuations caused by the loading effect during etching can be corrected without distinguishing the phenomena while also correcting the proximity effect.

The dose calculating unit 918 can suitably calculate a value obtained by further multiplying the dose D(x, U) calculated by using the selected set of the proximity effect correction coefficient η (x) and the base dose $D_{base}$ and the correction term $D_{corr}$ by a correction coefficient of the fogging effect defined for each map position to use the result thereof as the dose D(x, U).

As the beam irradiation time calculating process (S9130), the beam irradiation time calculating unit 920 calculates the beam irradiation time T of the electron beam 200 in each position of the write region. The dose D can be defined as a product of the beam irradiation time T and the current density J and thus, the beam irradiation time T can be determined by dividing the dose D by the current density J. The calculated beam irradiation time is output to the deflection control circuit 120.

As the writing process (S9132), the pattern writing unit 150 writes a desired pattern on the target object 101 by using the electron beam 200 of the dose obtained for each map position. A more concrete operation will be described below. The deflection control circuit 120 outputs a digital signal to control the beam irradiation time for each shot to the DAC amplification unit 130. Then, the DAC amplification unit 130 converts the digital signal into an analog signal and amplifies the analog signal, which is then applied to the blanking deflector 212 as a deflection voltage.

The electron beam 200 emitted from the electron gun assembly 201 (discharge unit) is controlled to pass through the blanking aperture plate 214 by the blanking deflector 212 when passing through the blanking deflector 212 in a beam ON state and controlled to be deflected so that the whole beam is blocked by the blanking aperture plate 214 in a beam OFF state. The electron beam 200 having passed through the blanking aperture plate 214 during a time from the beam OFF state to the beam ON state and back to the beam OFF state becomes an electron beam for one shot. The blanking deflector 212 alternately generates the beam ON state and the beam OFF state by controlling the orientation of the passing electron beam 200. For example, no voltage may be applied for the beam ON state and a voltage may be applied to the blanking deflector 212 for the beam OFF state. The dose of the electron beam 200 per shot shone on the target object 101 is adjusted by the beam irradiation time T of each of such shots.

The electron beam 200 of each shot generated by being passed through the blanking deflector 212 and the blanking aperture plate 214 illuminates the whole first shaping aperture plate 203 having an oblong, for example, rectangular hole through the illumination lens 202. Here, the electron beam 200 is first formed into an oblong, for example, a rectangular shape. Then, the electron beam 200 of a first aperture image having passed through the first shaping aperture plate 203 is projected onto the second shaping aperture plate 206 through the projection lens 204. The first aperture image is controlled to deflect by the deflector 205 on the second shaping aperture plate 206 so that the beam shape and dimensions thereof can be changed (variably shaped). Such variable shaping is performed for each shot and a different beam shape and dimensions are formed for each normal shot. Then, the electron beam 200 of a second aperture image having passed through the second shaping aperture plate 206 is focused by the objective lens 207 and deflected by the deflector 208 before being shone onto a desired position of the target object arranged on the continuously moving XY stage 105. Thus, a plurality of shots of the electron beam 200 is successively deflected onto the target object 101 to be a substrate by each deflector.

According to the fourth embodiment, as described above, dimensional fluctuations based on a plurality of phenomena can be corrected together. The dimension map for each proximity effect density is directly input for processing and thus, it is not necessary to, like in a conventional method, assign the correction width for each phenomenon from the user side. A case where it is necessary to correct η such as changing η for each of a plurality of phenomena according to a conventional method can also be handled. Furthermore, correction precision can be improved by introducing the correction term depending on the proximity effect density.

According to the fourth embodiment, as described above, the proximity effect correction coefficient and the base dose can be selected without being bound by proximity effect correction conditions. Then, dimension corrections can be made regardless of phenomena of dimensional fluctuations.

According to the fourth embodiment, as described above, entire dimensional fluctuations based on a plurality of phenomena such as dimensional fluctuations caused by the loading effect during development and dimensional fluctuations caused by the loading effect during etching can be corrected without distinguishing the phenomena while also correcting the proximity effect.

A diagram showing an example of the dose correction in the fourth embodiment is like in FIGS. 13A to 13C. FIG. 13A shows a case where the dimensional error $\Delta CD_0$ of the pattern dimension defined in the pattern dimension map 940 when the proximity effect density $U(x)=0$, 1 from the pattern dimension when $U(x)=0.5$ is, for example, 1 nm and $\Delta CD_{100}$ is, for example, -1 nm. FIG. 13C shows an example in such a case of the correlation between the pattern dimension CD and the proximity effect correction coefficient η. In the example of the correlation in FIG. 13C, the proximity effect correction coefficient η that generates $\delta_0=1$ and $\delta_{100}=-1$ is present. In this example, as shown in FIG. 13B, dimensional errors can be corrected without generating any correction residue by selecting the above proximity effect correction coefficient η. Thus, the correction term $D_{corr}=1$ can be set.

A diagram showing another example of the dose correction in the fourth embodiment is like in FIGS. 14A to 14C. FIG. 14A shows a case where the dimensional error $\Delta CD_0$ of the pattern dimension defined in the pattern dimension map 940 when the proximity effect density $U(x)=0$, 1 from the pattern dimension when $U(x)=0.5$ is, for example, 1 nm and $\Delta CD_{100}$ is, for example, 0 nm. In such a case, the proximity effect correction coefficient η that generates $\delta_0=1$ and $\delta_{100}=0$ is not present in the example of the correlation in FIG. 14C. Thus, as shown in FIG. 14B, for example, the proximity effect correction coefficient η that generates the correction residue of -0.5 nm for both is selected. By making such selection, a respective correction to some extent can be made, though not complete, when the proximity effect density $U(x)=0$, 1. In the fourth embodiment, the correction residue can also be corrected by using the correction term $D_{corr}$.

A diagram showing still another example of the dose correction in the fourth embodiment is like in FIGS. 15A and 15B. FIG. 15A shows a case where the dimensional error $\Delta CD_0$ of the pattern dimension defined in the pattern dimension map 940 when the proximity effect density $U(x)=0$, 1 from the pattern dimension when $U(x)=0.5$ is, for example, 1 nm and $\Delta CD_{100}$ is, for example, 1 nm. In such a case, the proximity effect correction coefficient η that generates $\delta_0=1$ and $\delta_{100}=1$ is not present in the example of the correlation in FIG. 15B. Dimensional fluctuations when the proximity effect density $U(x)=0$, 1 act in the direction of the opposite side and thus, it is difficult to correct both at the same time according to a conventional method. According to the fourth embodiment, by contrast, corrections can be made also in such a case by using the correction term $D_{corr}$.

In the foregoing, the embodiments have been described with reference to concrete examples. However, the present invention is not limited to such concrete examples.

Although parts such as an apparatus configuration and a control method which are not directly required for the explanation of the present invention have not been described, a required apparatus configuration or a required control method can be appropriately selected and used. For example, although the configuration of a control unit which controls the writing apparatus 100 has not been described, a required control unit configuration can be appropriately selected and used as a matter of course.

In addition, all charged particle beam writing apparatuses and writing methods which include the elements of the present invention and can be attained by appropriate change in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus, comprising:
   a storage unit configured to input and store a plurality of set data including a set of a proximity effect correction coefficient map and a base dose map of a beam;
   a first dose calculating unit configured to read each the set data and to calculate a first dose map for each set;
   a dimension map creation unit configured to create a dimension map of a pattern by using the first dose map calculated for each set;
   an adder configured to add dimensions of all sets for each position of the dimension map by using the dimension map of each set;

a set map creation unit configured to create a set of a proximity effect correction coefficient map and a base dose map by using an added dimension map after addition;

a second dose calculating unit configured to calculate a second dose map by using a created set of the proximity effect correction coefficient map and the base dose map; and a writing unit configured to write the pattern to a target object by using a charged particle beam of a dose defined in the second dose map.

2. The apparatus according to claim 1, wherein the plurality of set data includes the set data to correct dimensional fluctuations of a pattern caused by a loading effect when the target object is developed and the set data to correct dimensional fluctuations of a pattern caused by the loading effect when the target object is etched.

3. The apparatus according to claim 1, wherein the second dose calculating unit calculates, as the second dose map, a value obtained by further multiplying each value of a dose map calculated by using the created set of the proximity effect correction coefficient map and the base dose map by a correction coefficient of a fogging effect defined for each map position.

4. A charged particle beam writing apparatus, comprising:
a storage unit configured to input and store a plurality of set data including a set of a proximity effect correction coefficient map and a base dose map of a beam;

a first dose calculating unit configured to read each the set data and to calculates a first dose map for each set;

a dimension map creation unit configured to create a dimension map of a pattern for each of a plurality of proximity effect densities by using the first dose map calculated for each set;

an adder configured to add dimensions of all sets for each position of the dimension map for each proximity effect density by using a plurality of dimension maps for mutually different proximity effect densities of each set;

a selection unit configured to select a set of a proximity effect correction coefficient and a base dose with which dimensional errors of the pattern are corrected for a part of the proximity effect densities and correction residues of dimensional errors of the pattern are generated for a remaining proximity effect densities by using a plurality of added dimension maps for the mutually different proximity effect densities after addition;

a correction term calculating unit configured to calculate a correction term to correct the correction residues depending on the proximity effect density for each position of the map;

a second dose calculating unit configured to calculate a second dose map by using a selected set of the proximity effect correction coefficient and the base dose and the correction term in each position of the map; and a writing unit configured to write the pattern to a target object by using a charged particle beam of a dose defined in the second dose map.

5. A charged particle beam writing apparatus, comprising:
a storage unit configured to input and store a correlation information among a pattern area ratio, a proximity effect correction coefficient, and a base dose for each of a plurality of phenomena causing dimensional fluctuations in a mask plane when mask fabricating;

a first set map creation unit configured to read each of the correlation information and to create a first set of a proximity effect correction coefficient map and a base dose map to correct the phenomenon for each phenomenon;

a first dose calculating unit configured to calculate a first dose map by using a corresponding proximity effect correction coefficient map and a base dose map for each set of the first sets;

a dimension map creation unit configured to create a dimension map of a pattern by using the first dose map calculated for each set of the first sets;

an adder configured to add dimensions of all sets for each position of the dimension map by using the dimension map of each set of the first sets;

a set map creation unit configured to create a second set of a proximity effect correction coefficient map and a base dose map by using an added dimension map after addition;

a second dose calculating unit configured to calculate a second dose map by using the second set of the proximity effect correction coefficient map and the base dose map; and a writing unit configured to write the pattern to a target object by using a charged particle beam of a dose defined in the second dose map.

6. A charged particle beam writing apparatus, comprising:
a storage device configured to input and store a plurality of pattern dimension map data for mutually different proximity effect densities indicating a distribution of a pattern dimension formed on a substrate when a pattern is written to the substrate by making the proximity effect density variable;

a selection unit configured to select a set of a proximity effect correction coefficient and a base dose with which dimensional errors of the pattern dimension are corrected for a part of the proximity effect densities and correction residues of dimensional errors of the pattern dimension are generated for a remaining proximity effect densities when a writing position corresponding to a map position is written to with a dose obtained by a dose function correcting dimensional errors calculated by using the proximity effect correction coefficient and the base dose for each map position;

a correction term calculating unit configured to calculate a correction term to correct the correction residues depending on the proximity effect density for each map position;

a dose calculating unit configured to calculate a dose by using a selected set of the proximity effect correction coefficient and the base dose and the correction term for each map position; and a writing unit configured to write a desired pattern to the substrate by using a charged particle beam of the dose calculated for each map position.

7. The apparatus according to claim 6, wherein three proximity effect densities of 10% or less, 50%, and 90% or more are used as the mutually different proximity effect densities.

8. The apparatus according to claim 6, wherein the selection unit selects the set of the proximity effect correction coefficient and the base dose that makes the correction residues smaller for each map position.

9. The apparatus according to claim 6, wherein the dose calculating unit calculates for the each map position a value obtained by further multiplying the dose calculated by using the selected set of the proximity effect correction coefficient and the base dose and the correction term by a correction coefficient of a fogging effect defined for each map position.

10. The apparatus according to claim 6, wherein one of the mutually different proximity effect densities is set as a reference proximity effect density and the set of the proximity effect correction coefficient and the base dose is correlated so that the desired pattern dimension is obtained in the reference proximity effect density, the storage device further stores correlation data among a plurality of sets of the proximity effect correction coefficient and the base dose, the pattern dimensions obtained for each of the plurality of sets in the reference proximity effect density, and dimensional fluctuation amounts for the plurality of sets in a remaining proximity effect densities, and the selection unit selects the set of the proximity effect correction coefficient and the base dose by referring to the correlation data.

11. A charged particle beam writing method, comprising:

reading each of set data from a storage device storing a plurality of set data including a set of a proximity effect correction coefficient map and a base dose map and calculating a first dose map for each set;

creating a dimension map of a pattern by using a calculated first dose map for each set;

adding dimensions of all sets for each position of the dimension map by using the dimension map of each set;

creating a set of a proximity effect correction coefficient map and a base dose map by using an added dimension map after addition;

calculating a second dose map by using a created set of the proximity effect correction coefficient map and the base dose map; and writing the pattern to a target object by using a charged particle beam of a dose defined in the second dose map.

12. The method according to claim 11, wherein when the second dose is calculated, a value obtained by further multiplying each value of a dose map calculated by using the created set of the proximity effect correction coefficient map and the base dose map by a correction coefficient of a fogging effect defined for each map position is calculated as the second dose map.

13. A charged particle beam writing method, comprising:

reading each piece of set data from a storage device storing a plurality of set data including a set of a proximity effect correction coefficient map and a base dose map and calculating a first dose map for each set;

creating a plurality of dimension maps of a pattern for a plurality of proximity effect densities by using a calculated first dose map for each set;

adding dimensions of all sets in each position of the dimension map for each proximity effect density by using a plurality of dimension maps for mutually different proximity effect densities of each set;

selecting a set of a proximity effect correction coefficient and a base dose with which dimensional errors of the pattern are corrected for a part of the proximity effect densities and correction residues of dimensional errors of the pattern are generated for a remaining proximity effect densities by using a plurality of added dimension maps for the mutually different proximity effect densities after addition;

calculating a correction term to correct the correction residues depending on the proximity effect density for each position of the map;

calculating a second dose map by using a selected set of the proximity effect correction coefficient and the base dose and the correction term in each position of the map; and writing the pattern to a target object by using a charged particle beam of a dose defined in the second dose map.

14. A charged particle beam writing method, comprising:

reading a plurality of pattern dimension map data from a storage device storing the plurality of pieces of pattern dimension map data, for mutually different proximity effect densities, indicating a distribution of a pattern dimension formed on a substrate when a pattern is written to the substrate by making the proximity effect density variable;

selecting a set of a proximity effect correction coefficient and a base dose with which dimensional errors of the pattern dimension are corrected for a part of the proximity effect densities and correction residues of dimensional errors of the pattern dimension are generated for a remaining proximity effect densities when a writing position corresponding to a map position is written to with a dose obtained by a dose function correcting dimensional errors calculated by using the proximity effect correction coefficient and the base dose for each map position;

calculating a correction term to correct the correction residues depending on the proximity effect density for each map position;

calculating a dose by using a selected set of the proximity effect correction coefficient and the base dose and the correction term for each map position; and writing the desired pattern to the substrate by using a charged particle beam of the dose calculated for each map position.

15. The method according to claim 14, wherein when the dose is calculated, for the each map position, a value obtained by further multiplying a dose calculated by using the selected set of the proximity effect correction coefficient and the base dose and the correction term by a correction coefficient of a fogging effect defined for each map position is calculated.

* * * * *